(12) United States Patent
Ifuku et al.

(10) Patent No.: US 11,091,836 B2
(45) Date of Patent: Aug. 17, 2021

(54) GRAPHENE STRUCTURE FORMING METHOD AND GRAPHENE STRUCTURE FORMING APPARATUS

(71) Applicant: TOKYO ELECTRON LIMITED, Tokyo (JP)

(72) Inventors: Ryota Ifuku, Nirasaki (JP); Takashi Matsumoto, Nirasaki (JP)

(73) Assignee: TOKYO ELECTRONICS LIMITED, Tokyo (JP)

( * ) Notice: Subject to any disclaimer, the term of this patent is extended or adjusted under 35 U.S.C. 154(b) by 0 days.

(21) Appl. No.: 16/131,458

(22) Filed: Sep. 14, 2018

(65) Prior Publication Data
US 2019/0085457 A1 Mar. 21, 2019

(30) Foreign Application Priority Data
Sep. 20, 2017 (JP) .............................. JP2017-180049

(51) Int. Cl.
*C23C 16/511* (2006.01)
*C23C 16/26* (2006.01)
(Continued)

(52) U.S. Cl.
CPC ............ *C23C 16/511* (2013.01); *C23C 16/26* (2013.01); *C23C 16/452* (2013.01);
(Continued)

(58) Field of Classification Search
CPC . C23C 16/26; C23C 16/452; C23C 16/45561; C23C 16/45565; C23C 16/511;
(Continued)

(56) References Cited

U.S. PATENT DOCUMENTS 7,585,765 B2   9/2009 Yang et al.
7,655,111 B2 * 2/2010 Horiguchi ......... H01J 37/32192
                                                   156/345.41
(Continued)

FOREIGN PATENT DOCUMENTS

JP    2005-97113 A    4/2005
JP    2005203348 A    7/2005
(Continued)

OTHER PUBLICATIONS

English translation of Hiramatsu et al., "Fabriication of Carbon Nano walls using Plasma-Enhanced Chemical Vapor Deposition"; Journal of surface science, vol. 35, No. 17 pp. 144-149, special issue 2010, Japanese article cited in Sep. 14, 2018 IDS.*
(Continued)

*Primary Examiner* — Dah-Wei D. Yuan
*Assistant Examiner* — Nga Leung V Law
(74) *Attorney, Agent, or Firm* — Nath, Goldberg & Meyer; Jerald L. Meyer; Tanya E. Harkins

(57) ABSTRACT

A graphene structure forming method for forming a graphene structure is provided. The method comprises preparing a target substrate, and forming the graphene structure on a surface of the target substrate by remote microwave plasma CVD using a carbon-containing gas as a film-forming raw material gas in a state in which the surface of the target substrate has no catalytic function.

8 Claims, 22 Drawing Sheets

(51) Int. Cl.
*C23C 16/52* (2006.01)
*C23C 16/452* (2006.01)
*C23C 16/455* (2006.01)
*H01L 21/02* (2006.01)
*H01J 37/32* (2006.01)

(52) U.S. Cl.
CPC .. *C23C 16/45561* (2013.01); *C23C 16/45565* (2013.01); *C23C 16/52* (2013.01); *H01J 37/3222* (2013.01); *H01J 37/3244* (2013.01); *H01J 37/32311* (2013.01); *H01J 37/32724* (2013.01); *H01L 21/0259* (2013.01); *H01L 21/0262* (2013.01); *H01L 21/02381* (2013.01); *H01L 21/02425* (2013.01); *H01L 21/02488* (2013.01); *H01L 21/02491* (2013.01); *H01L 21/02527* (2013.01); *H01J 2237/3321* (2013.01); *Y10S 977/844* (2013.01)

(58) Field of Classification Search
CPC .............. C23C 16/52; C23C 16/45536; H01L 21/02381; H01L 21/02425; H01L 21/02488; H01L 21/02491; H01L 21/02527; H01L 21/0259; H01L 21/0262; H01L 29/1606; H01L 21/02274; H01L 21/324; H01L 21/02115; H01L 21/670107; H01J 37/3222; H01J 37/32311; H01J 37/3244; H01J 37/32724; H01J 2237/3321; Y10S 977/844; C01B 32/18; C01B 32/186
USPC .................................................. 427/575, 577
See application file for complete search history.

(56) References Cited

U.S. PATENT DOCUMENTS

| | | | |
|---|---|---|---|
| 8,277,872 | B1 | 10/2012 | Al-Haik et al. |
| 8,728,917 | B2 | 5/2014 | Matsumoto et al. |
| 9,187,824 | B2 | 11/2015 | Fisher et al. |
| 9,822,009 | B2 | 11/2017 | Kagaya et al. |
| 9,911,544 | B1* | 3/2018 | Meyyappan ........... H01G 11/28 |
| 10,167,572 | B2 | 1/2019 | Veerasamy |
| 10,557,200 | B2* | 2/2020 | Ikeda ................... H01J 37/3244 |
| 2002/0117951 | A1 | 8/2002 | Merkulov et al. |
| 2003/0178144 | A1 | 9/2003 | Ohmi et al. |
| 2003/0203139 | A1 | 10/2003 | Ren et al. |
| 2007/0137575 | A1 | 6/2007 | Ohmi |
| 2007/0184190 | A1 | 8/2007 | Hiramatsu et al. |
| 2009/0099004 | A1 | 4/2009 | Henderson et al. |
| 2009/0273106 | A1 | 11/2009 | Lin et al. |
| 2009/0320756 | A1 | 12/2009 | Tanaka |
| 2010/0102291 | A1 | 4/2010 | Xu |
| 2010/0200208 | A1 | 8/2010 | Cola et al. |
| 2011/0033688 | A1 | 2/2011 | Veerasamy |
| 2011/0039355 | A1* | 2/2011 | Zhao ................... H01J 37/32192 438/9 |
| 2011/0045207 | A1* | 2/2011 | Hori ........................ B82Y 30/00 427/577 |
| 2011/0136346 | A1 | 6/2011 | Geissbuhler et al. |
| 2012/0090782 | A1* | 4/2012 | Ikeda ................ H01J 37/32293 156/345.28 |
| 2012/0192931 | A1 | 8/2012 | Jeon et al. |
| 2012/0220106 | A1 | 8/2012 | Matsumoto et al. |
| 2012/0247676 | A1* | 10/2012 | Fujino ................ H01J 37/32211 156/345.41 |
| 2012/0322223 | A1 | 12/2012 | Oh et al. |
| 2013/0052119 | A1* | 2/2013 | Kim ....................... B82Y 30/00 423/445 B |
| 2013/0059091 | A1 | 3/2013 | Matsumoto et al. |
| 2013/0075929 | A1 | 3/2013 | Katagiri et al. |
| 2013/0217226 | A1 | 8/2013 | Kitamura et al. |
| 2013/0266739 | A1 | 10/2013 | Lin et al. |
| 2013/0270188 | A1 | 10/2013 | Karnik et al. |
| 2014/0065426 | A1* | 3/2014 | Ishihara ................. B82Y 40/00 428/408 |
| 2014/0187033 | A1 | 7/2014 | Yamazaki et al. |
| 2014/0199829 | A1* | 7/2014 | Matsumoto ....... H01L 23/53276 438/610 |
| 2014/0287155 | A1 | 9/2014 | Matsumoto |
| 2015/0037515 | A1 | 2/2015 | Fisher et al. |
| 2015/0194290 | A1* | 7/2015 | Nozawa ............ H01J 37/32715 156/345.34 |
| 2015/0212127 | A1* | 7/2015 | Ikeda .................... H01J 37/321 324/638 |
| 2015/0255258 | A1* | 9/2015 | Nozawa ............ C23C 16/4584 156/345.42 |
| 2016/0017484 | A1* | 1/2016 | Kikuchi ................ C23C 16/452 427/569 |
| 2016/0075560 | A1* | 3/2016 | Kagaya ............... C23C 16/0281 427/569 |
| 2016/0222516 | A1* | 8/2016 | Ikeda ................... H01J 37/3244 |
| 2016/0284516 | A1* | 9/2016 | Ikeda ................... H01J 37/3222 |
| 2017/0029942 | A1 | 2/2017 | Matsumoto |
| 2017/0102358 | A1 | 4/2017 | Hoffman |
| 2017/0221716 | A1* | 8/2017 | Shiraga ........... H01L 21/823857 |
| 2017/0263421 | A1* | 9/2017 | Ikeda ................ H01J 37/32715 |
| 2017/0309452 | A1* | 10/2017 | Fujino ............... H01J 37/32715 |
| 2018/0033727 | A1 | 2/2018 | Lee et al. |
| 2018/0057933 | A1 | 3/2018 | Ifuku et al. |
| 2018/0114677 | A1* | 4/2018 | Komatsu ........... H01J 37/32302 |
| 2019/0010604 | A1 | 1/2019 | Boyd et al. |
| 2019/0085457 | A1 | 3/2019 | Ifuku et al. |

FOREIGN PATENT DOCUMENTS

| | | |
|---|---|---|
| JP | 201168513 A | 4/2011 |
| JP | 201196980 A | 5/2011 |
| JP | 2011201735 A | 10/2011 |
| JP | 2013-58669 A | 3/2013 |
| JP | 2013-100205 A | 5/2013 |
| JP | 5414760 B2 | 11/2013 |
| JP | 2014-231455 A | 12/2014 |
| KR | 1020110092207 A | 8/2011 |
| KR | 1020110101676 A | 9/2011 |
| KR | 1020120012271 A | 2/2012 |
| KR | 10-2014-0041480 A | 4/2014 |
| KR | 1020140093939 A | 7/2014 |
| KR | 1020160059466 A | 5/2016 |
| WO | 2011115197 A1 | 9/2011 |

OTHER PUBLICATIONS

Kim, Jaeho, et al. "Low-temperature synthesis of large-area graphene-based transparent conductive films using surface wave plasma chemical vapor deposition" Applied Physics Letters 98, 091502, (2011), pp. 1-3.
Malesevic, Alexander, et al. "Synthesis of few-layer graphene via microwave plasma-enhanced chemical vapour deposition" Nanotechnology 19, (2008), 305604; 6 pages.
Kondo, Daiyu, et al. "Low-Temperature Syntheseis of Graphene and Fabrication of Top-Gated Field Effect Transistors without Using Transfer Processes" Applied Physics Express 3, (2010), 025102, pp. 1-3.
JP International Search Report; Application No. PCT/JP2012/078585; PCT No. of U.S. Appl. No. 14/355,601 and U.S. Appl. No. 15/294,971; dated Jan. 29, 2013; 2 pages.
Hiramatsu, Mineo , et al. "Fabrication of Carbon Nanowalls using Plasma-enhanced Chemical Vapor Deposition", pp. 144-149, 2010, along with English translation of pp. 147, 1st Column, Line 16-20, Article in Japanese, with English abstract & figure captions in English; with only p. 147 first column, lines 16-20 translated.
Hisamitsu, Mineo, et al."Fabrication of Carbon Nanowalls Using Plasma-Enhanced Chemical Vapor Deposition"; Nov. 5, 2005.

* cited by examiner

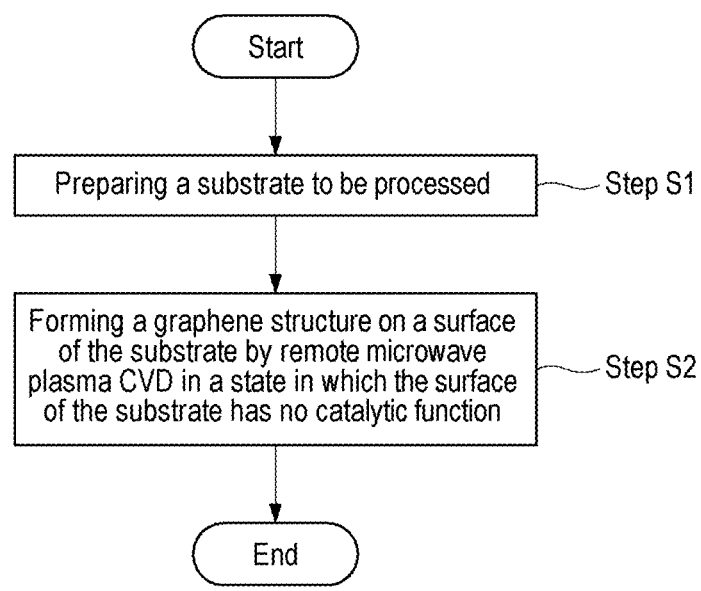

GRAPHENE STRUCTURE FORMING METHOD AND GRAPHENE STRUCTURE FORMING APPARATUS

CROSS-REFERENCE TO RELATED APPLICATION

This application is based upon and claims the benefit of priority from Japanese Patent Application No. 2017-180049, filed on Sep. 20, 2017, the entire contents of which are incorporated herein by reference.

TECHNICAL FIELD

The present disclosure relates to a graphene structure forming method and a graphene structure forming apparatus.

BACKGROUND

Graphene is obtained by forming a thin film of graphite of about 1 to several tens or several hundreds of atomic layers on a substrate. As a graphene structure, in addition to ordinary graphene formed parallel to a substrate, there is known a carbon nanowall (hereinafter also referred to as CNW) in which several layers of graphene sheets are grown at an angle to a substrate, typically perpendicularly to a substrate.

Graphene is formed as an aggregate of six-membered ring structures by covalent bonding ($sp^2$ bond) of carbon atoms. Graphene exhibits peculiar electronic characteristics such that the mobility thereof is 200000 $cm^2$/Vs or more, which is 100 times or more of the mobility of silicon (Si), and the current density thereof is $10^9$ A/$cm^2$, which is 1000 times or more of the current density of Cu.

Due to such characteristics, graphene is attracting attention as a material for various devices such as a wiring, a field effect transistor (FET) channel, a barrier film and the like. Due to its structural characteristics, the CNW is attracting attention as a material for various devices such as a fuel cell, a field electron emission source, a sensor and the like.

As a graphene forming method, there has been proposed a method in which a metal catalyst layer is formed on a workpiece, an activation treatment of the metal catalyst layer is performed, and then graphene is formed by chemical vapor deposition (CVD). CVD using microwave plasma is known as an example of CVD.

As a carbon nanowall forming method, there has been proposed a method in which a plasma atmosphere is formed by parallel flat plate type capacitively coupled plasma (CCP), hydrogen radicals are injected into the plasma atmosphere, and a carbon nanowall is formed on a surface of a substrate.

However, in the CVD using microwave plasma, the base is limited to the metal catalyst layer, and the activation treatment of the metal catalyst layer is necessary. Thus, the process is complex.

In the carbon nanowall forming method, a growth reaction of a carbon nanowall occurs in the plasma or in the region where an electron temperature is high. Therefore, damage is caused by high-energy ions, and multiple nuclei are generated by highly active carbon radicals. This makes it difficult to improve the crystallinity.

SUMMARY

Some embodiments of the present disclosure provide a method and apparatus capable of forming a graphene structure without going through formation of a metal catalyst layer and activation of the metal catalyst layer.

Furthermore, some embodiments of the present disclosure provide a method and apparatus capable of forming a graphene structure including a carbon nanowall which is less likely to be damaged by high-energy ions and which has good crystallinity.

According to one embodiment of the present disclosure, there is provided a graphene structure forming method for forming a graphene structure, including: preparing a target substrate; and forming a graphene structure on a surface of the target substrate by remote microwave plasma CVD using a carbon-containing gas as a film-forming raw material gas in a state in which the surface of the target substrate has no catalytic function.

According to another embodiment of the present disclosure, there is provided a graphene structure forming method for forming a graphene structure, including: preparing a target substrate; and forming a graphene structure including a carbon nanowall on a surface of the target substrate by remote microwave plasma CVD using a carbon-containing gas as a film-forming raw material gas.

According to yet another embodiment of the present disclosure, there is provided a graphene structure forming apparatus for forming a graphene structure, including: a processing container configured to accommodate a target substrate; a mounting table configured to horizontally mount the target substrate inside the processing container; a heating mechanism configured to heat the target substrate; a planar slot antenna provided with slots and disposed on the processing container via a microwave transmitting plate which is made of a dielectric material and constitutes a ceiling wall of the processing container; a microwave introduction mechanism configured to introduce microwaves into the processing container via the slots and the microwave transmitting plate; a gas supply mechanism configured to supply a gas including a carbon-containing gas as a film-forming raw material gas into the processing container; an exhaust mechanism configured to exhaust the inside of the processing container; and a controller configured to control the heating mechanism, the microwave introduction mechanism, the gas supply mechanism and the exhaust mechanism, wherein the controller controls the heating mechanism, the microwave introduction mechanism, the gas supply mechanism and the exhaust mechanism so that the graphene structure forming method is performed.

According to still another embodiment of the present disclosure, there is provided a graphene structure forming apparatus for forming a graphene structure, including: a processing container configured to accommodate the target substrate; a mounting table configured to horizontally mount the target substrate inside the processing container; a heating mechanism configured to heat the target substrate; a microwave introduction device provided on the processing container; a gas supply mechanism configured to supply a gas including a carbon-containing gas as a film-forming raw material gas into the processing container; an exhaust mechanism configured to exhaust an interior of the processing container; and a controller configured to control the heating mechanism, the microwave introduction device, the gas supply mechanism and the exhaust mechanism, wherein the microwave introduction device includes a microwave generator configured to generate microwaves, and a plurality of microwave radiation mechanisms supplied with the microwave distributed from the microwave generator and configured to radiate the microwave into the processing container, each of the microwave radiation mechanisms includes a tuner configured to perform impedance matching, a planar slot antenna having slots configured to radiate the microwave, and a microwave transmitting plate that is provided just below the planar slot antenna, fitted to a ceiling wall of the processing container and made of a dielectric material, and the controller controls the heating mechanism, the microwave introduction device, the gas supply mechanism and the exhaust mechanism so that the graphene structure forming method is performed.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flow chart showing a graphene structure forming method according to a first embodiment.

DETAILED DESCRIPTION

Figure 2A:
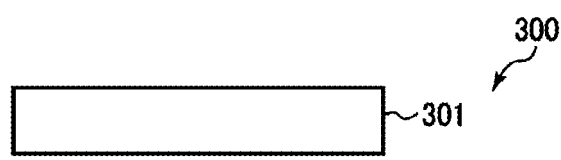
FIGS. 2A to 2C are sectional views showing a specific example of a structure of a target substrate in the graphene structure forming method according to the first embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiment of Graphene Structure Forming Method

First Embodiment

First, a first embodiment of a graphene structure forming method will be described. In the related art described above, in order to efficiently grow graphene having good crystallinity at as low a temperature as possible, a metal catalyst layer composed of a catalyst such as Ni or the like for promoting the growth of graphene is formed as a base. The metal catalyst layer is activated by plasma of an $H_2$ gas, which is a reducing gas, and an $N_2$ gas, which is a nitrogen-containing gas. Then, graphene is grown by plasma CVD. That is to say, in the related art, graphene is grown by dissociating a film-forming raw material gas (precursor) using a catalytic reaction by the metal catalyst layer.

In contrast, as a result of studies conducted by the present inventors, the following has been found. Microwaves are introduced into a processing container so that plasma is generated by a microwave electric field. The plasma (remote microwave plasma) diffused from a plasma generation region is caused to act on a target substrate existing at a position spaced apart from the plasma generation region. Thus, a carbon-containing gas as a film-forming raw material gas (precursor) can be dissociated at a relatively low temperature into a state suitable for the growth of graphene. As a result, a graphene structure having good crystallinity can be formed without having to use an activated metal catalyst layer that is necessary in the related art.

In the related art, microwave plasma is used as the plasma for CVD when forming graphene. However, it is considered that the dissociation of the film-forming raw material gas (precursor) by the catalytic action of the metal catalyst layer is indispensable regardless of the plasma CVD method. In contrast, the present embodiment is based on the new finding that a graphene structure having good crystallinity can be formed at a relatively low temperature on a substrate having no catalytic function by the dissociation of a film-forming raw material gas (precursor) using remote microwave plasma, which is completely different in principle from the catalytic reaction by an activated metal catalyst in the related art.

As shown in FIG. 1, the graphene structure forming method of the present embodiment includes a step (step S1) of preparing a target substrate and a step (step S2) of forming a graphene structure on a surface of the target substrate by remote microwave plasma CVD in a state in which the surface of the target substrate has no catalytic function.

In the target substrate used in step S1, it is only necessary that the surface on which a graphene structure is formed does not have a catalytic function in the remote microwave plasma CVD of step S2. The surface of the target substrate may be a semiconductor or may be an insulator. Even if the surface of the target substrate is a metal, the activation treatment is not performed before the remote microwave plasma CVD process. It is only necessary that the surface of the target substrate has no catalytic function during the remote microwave plasma CVD process.

Figure 2B:
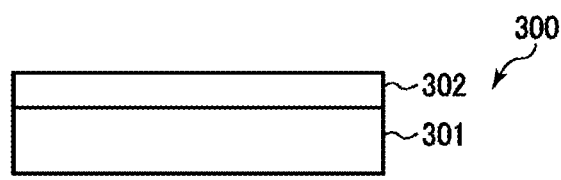
Figure 2C:
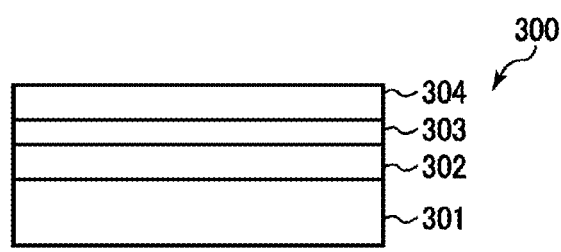

FIGS. 2A to 2C show a specific example of the target substrate. Typically, a semiconductor wafer may be used as a target substrate 300. Examples of the target substrate 300 include a substrate composed of only a semiconductor base 301 made of a semiconductor such as silicon or the like as shown in FIG. 2A, a substrate in which an insulating film 302 such as an $SiO_2$ film or the like is formed on a semiconductor base 301 made of silicon or the like as shown in FIG. 2B, and a substrate in which a metal film 304 such as a Cu film or the like is formed on a semiconductor base 301 made of silicon or the like via an insulating film 302 such as an $SiO_2$ film or the like and a barrier film 303 such as a TaN film, a Ta film, a TiN film or the like. Depending on the kind of metal, the barrier film 303 may be omitted. In addition, the barrier film 303 may be a stacked film (for example, Ta/TaN).

Figure 3:
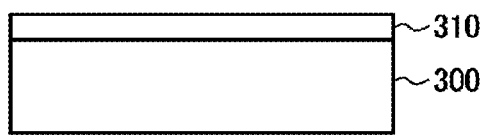
FIG. 3 is a sectional view showing a state in which a graphene structure is formed on a target substrate by the graphene structure forming method according to the first embodiment.

When forming the graphene structure by remote microwave plasma CVD in step S2, the target substrate is accommodated in a processing container. A Microwaves are introduced into the processing container to generate microwave plasma. The plasma is diffused to the target substrate 300 disposed at a position spaced apart from a plasma generation region. By using a carbon-containing gas as a film-forming raw material gas dissociated in the plasma, a graphene structure 310 is grown on the target substrate 300 as shown in FIG. 3.

Preferably, while introducing a microwaves, a plasma generation gas composed of a rare gas is introduced into the processing container to generate microwave plasma. A carbon-containing gas as a film-forming raw material gas is dissociated by the plasma and is supplied to the target substrate 300 spaced apart from a plasma generation region. A graphene structure 310 is grown on the target substrate 300.

As the rare gas, it may be possible to use Ar, He, Ne, Kr, Xe and the like, among which Ar capable of stably generating plasma is preferred.

Examples of the carbon-containing gas as the film-forming raw material gas include ethylene ($C_2H_4$), methane ($CH_4$), ethane ($C_2H_6$), propane ($C_3H_8$), propylene ($C_3H_6$), acetylene ($C_2H_2$), methanol ($CH_3OH$), ethanol ($C_2H_5OH$) and the like. In addition to the carbon-containing gas, a hydrogen-containing gas such as an $H_2$ gas or the like may be introduced. The quality of the graphene structure 310 can be improved by the hydrogen-containing gas such as an $H_2$ gas or the like.

The film-forming raw material gas may be introduced to a predetermined position between the plasma generation region and the target substrate vicinity region depending on the required degree of dissociation. That is, in the plasma generation region, the degree of dissociation is increased by high-energy plasma, and in the target substrate vicinity region, the degree of dissociation is lower than that in the plasma generation region due to the plasma of low electron temperature diffused from the plasma generation region. Therefore, it is possible to adjust the degree of dissociation of the film-forming raw material gas depending on the introduction position of the film-forming raw material gas.

According to the remote microwave plasma CVD, the target substrate is disposed in a region spaced apart from the microwave plasma generation region, and the plasma diffused from the plasma generation region is supplied to the target substrate. Therefore, the plasma has a low electron temperature on the target substrate, the damage is low, and the high-density plasma mainly composed of radicals is generated by the microwaves. With such plasma, it is possible to cause the carbon-containing gas to react on the surface of the target substrate, and it is possible to form a graphene structure 310 having good crystallinity without having to use an activated metal catalyst layer which has been necessary in the related art.

The graphene structure may be composed of only ordinary graphene formed parallel to the substrate, or may include CNW, which is grown at an angle to the substrate, in addition to graphene.

As the process conditions used at this time, it is preferable that the temperature of the target substrate is 350 to 1000 degrees C., more preferably 400 to 800 degrees C., and the microwave power is 100 to 5000 W. When the surface of the target substrate is an insulator and a semiconductor, it is preferable that the pressure in the processing container is 1.33 to 667 Pa (0.01 to 5 Torr). When the surface of the target substrate is a metal, it is preferable that the pressure in the processing container is 1.33 To 400 Pa (0.01 to 3 Torr). This pressure range is lower than the pressure in the related art described above. The low pressure is more advantageous in order to form a graphene structure without providing an activated metal catalyst layer. The time is preferably in a range of 1 to 200 min.

The flow rates of the rare gas, the carbon-containing gas and the hydrogen-containing gas used as plasma generation gases are appropriately set according to the type of gas and the apparatus used.

Prior to the formation of the graphene structure by the remote microwave plasma CVD in step S2, a surface treatment may be performed for the purpose of cleaning the surface of the target substrate. An example of the surface treatment may be a treatment in which an $H_2$ gas or a combination of an Ar gas and an $H_2$ gas is supplied while heating the target substrate to 300 to 600 degrees C. At this time, plasma may be generated. This surface treatment is merely for the purpose of cleaning the surface of the target substrate and may be performed not only when the surface of the substrate is a semiconductor or an insulator but also when the surface of the substrate is a metal.

Second Embodiment

Next, a second embodiment of a graphene structure forming method will be described. In the present embodiment, a graphene structure including CNW is formed by the same remote microwave plasma CVD as that of the first embodiment.

In the related art described above, it is known that graphene is formed on the activated metal catalyst layer by remote microwave plasma CVD but there is no formation of CNW. On the other hand, in another related art described above, a plasma atmosphere is formed by parallel flat plate type capacitively coupled plasma (CCP), and hydrogen radicals are injected into the plasma atmosphere to form CNW on the surface of the substrate. However, since the growth reaction of the CNW occurs in the plasma or in the region where an electron temperature is high, high-energy ions impart damage and crystallinity deteriorates.

In the course of conducting an experiment of forming a graphene structure by remote microwave plasma CVD without a metal catalyst layer and an activation treatment as in the first embodiment, the present inventors have found that both graphene parallel to a substrate and CNW growing at an angle to a substrate are formed under a predetermined low pressure condition. In addition, the present inventors have found that under a low pressure condition, CNW grows even when a metal catalyst layer is provided and an activation treatment is performed as in the related art.

Figure 4:
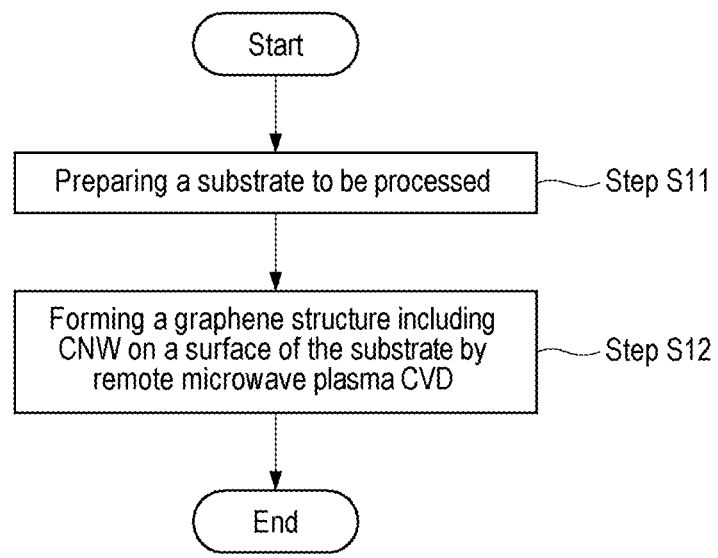
FIG. 4 is a flowchart showing a graphene structure forming method according to a second embodiment.

As shown in FIG. 4, the graphene structure forming method of the present embodiment includes a step (step S11) of preparing a target substrate and a step (step S12) of forming a graphene structure including CNW on a surface of the target substrate by remote microwave plasma CVD.

In the target substrate used in step S11, the surface on which the graphene structure is formed is arbitrary. The surface may be a semiconductor, an insulator or a metal. Specific examples of the target substrate include those shown in FIGS. 2A to 2C.

Figure 5:
FIG. 5 is a sectional view showing a state in which a graphene structure including CNW is formed on a target substrate by the graphene structure forming method according to the second embodiment.

When forming the graphene structure including the CNW by remote microwave plasma CVD in step S12, the target substrate is accommodated in a processing container. Microwaves are introduced into the processing container to generate microwave plasma. The plasma is diffused to the target substrate disposed at a position spaced apart from a plasma generation region. As shown in FIG. 5, graphene 321 and CNW 322 are grown on the target substrate 300, thereby forming a graphene structure 320 composed of the graphene 321 and the CNW 322.

Preferably, microwaves are introduced into the processing container and a plasma generation gas composed of a rare gas is introduced into the processing container to generate microwave plasma. A carbon-containing gas as a film-forming raw material gas is dissociated by the plasma and is supplied to the target substrate 300 spaced apart from a plasma generation region. Thus, a graphene structure 320 composed of graphene 321 and CNW 322 is formed on the target substrate 300. At this time, the surface of the target substrate is a metal catalyst layer. By performing an activation treatment of the metal catalyst layer prior to the formation of the graphene structure, it is possible to allow CNW to grow even in a state in which a catalytic function is exhibited.

As the plasma generation gas and the carbon-containing gas which is the film-forming raw material gas, it may be possible to use the same ones as used in the first embodiment. A hydrogen-containing gas such as an $H_2$ gas or the like may be introduced together with the carbon-containing gas. As in the first embodiment, the film-forming raw material gas may be introduced to a predetermined position between the plasma generation region and the target substrate vicinity region depending on the required degree of dissociation.

According to the remote microwave plasma CVD, the target substrate is arranged in a region spaced apart from the microwave plasma generation region, and the plasma diffused from the microwave plasma generation region is supplied to the target substrate. Thus, the electron temperature is low on the target substrate. Due to the microwaves, the plasma becomes high-density plasma mainly composed of radicals. Therefore, it is possible to form a graphene structure including CNW, which does not cause damage due to high-energy ions as in the related art and which has good crystallinity.

As the process conditions at this time, it is preferable that the temperature of the target substrate is 350 to 1000 degrees C. (more preferably 400 to 800 degrees C.) and the microwave power is 100 to 5000 W. Further, the pressure inside the processing container is preferably 1.33 to 133 Pa (0.01 to 1 Torr). If the pressure is higher than 133 Pa (1 Torr), it is difficult for CNW to grow even if the processing time is prolonged.

In the case where a metal catalyst layer is provided on the surface of the target substrate and an activation treatment is performed, as in the related art, the metal catalyst layer may be formed of a metal such as Ni, Co, Cu, Ru, Pt, Pd or the like, or an alloy containing any one of them. The activation treatment is preferably performed at a pressure of 66.7 to 400 Pa (0.5 to 3 Torr) and in a temperature range of 300 to 600 degrees C. by generating plasma of a reducing gas such as an $H_2$ gas or the like and a nitrogen-containing gas such as an $N_2$ gas or the like. The time for plasma CVD is preferably in a range of 1 to 200 min. Since the presence or absence of growth of CNW may also depend on time, the process time is set to the time during which CNW can grow according to process conditions other than time.

The flow rates of the rare gas, the carbon-containing gas, the hydrogen-containing gas and the like used as the plasma generation gases are appropriately set according to the type of gas and the apparatus used.

Also in the present embodiment, prior to formation of the graphene structure by remote microwave plasma CVD in step S12, a surface treatment may be performed for the purpose of cleaning the surface of the target substrate as in the first embodiment.

<Processing Apparatus>

Next, an example of a processing apparatus suitable for carrying out the graphene structure forming methods according to the above two embodiments will be described.

(First Example of Processing Apparatus)

Figure 6:
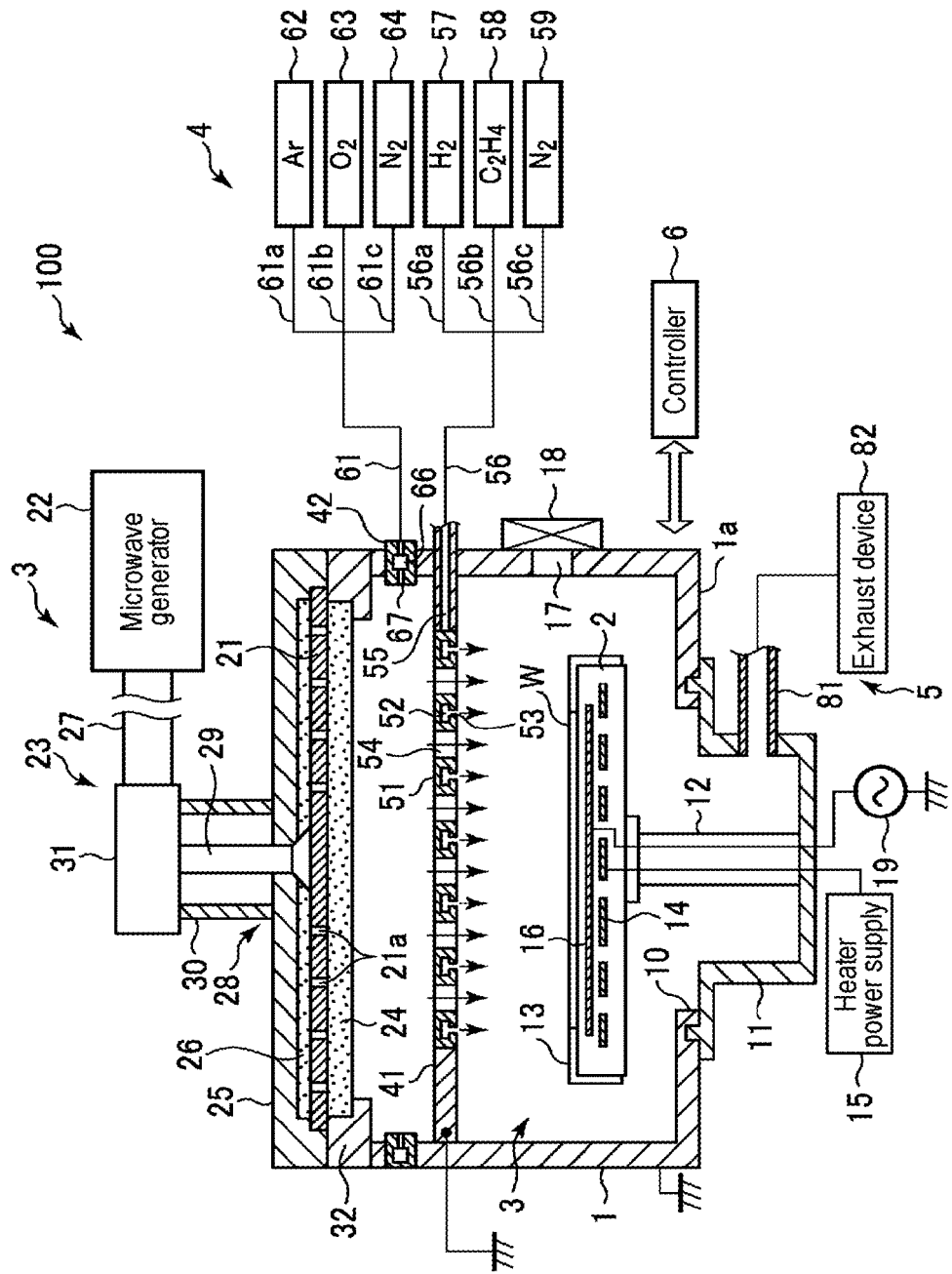
FIG. 6 is a sectional view showing a first example of a processing apparatus suitable for carrying out the graphene structure forming methods according to the first and second embodiments of the present disclosure.

FIG. 6 is a sectional view schematically showing a first example of the processing apparatus. The processing apparatus 100 shown in FIG. 6 is configured as, for example, an RLSA (registered trademark) microwave plasma type plasma processing apparatus.

The processing apparatus 100 includes a substantially cylindrical processing container 1, a mounting table 2 provided in the processing container 1 and configured to mount, for example, a semiconductor wafer (hereinafter simply referred to as a wafer) W as a target substrate, a microwave introduction mechanism 3 configured to introduce a microwaves into the processing container 1, a gas supply mechanism 4 configured to introduce a gas into the processing container 1, an exhaust part 5 configured to exhaust the inside of the processing container 1, and a controller 6 configured to control respective components of the processing apparatus 100.

A circular opening 10 is formed substantially at the center of a bottom wall 1a of the processing container 1. An exhaust chamber 11 communicating with the opening 10 and protruding downward is provided in the bottom wall 1a. A loading/unloading port 17 for loading and unloading the wafer W and a gate valve 18 for opening and closing the loading/unloading port 17 are provided in the side wall of the processing container 1.

The mounting table 2 has a circular plate shape and is made of a ceramic such as AlN or the like. The mounting table 2 is supported by a cylindrical support member 12 made of a ceramic such as AlN or the like and extending upward from the center of the bottom portion of the exhaust chamber 11. A guide ring 13 for guiding the wafer W is provided on the outer edge portion of the mounting table 2. Lift pins (not shown) for raising and lowering the wafer W is provided in the mounting table 2 so as to protrude and retract relative to the upper surface of the mounting table 2. Furthermore, a resistor heating type heater 14 is embedded in the mounting table 2. The heater 14 heats the wafer W on the mounting table 2 via the mounting table 2 by being supplied with electric power from a heater power supply 15. In addition, a thermocouple (not shown) is inserted in the mounting table 2. Based on a signal from the thermocouple, the heating temperature of the wafer W can be controlled to a predetermined temperature in a range of, for example, 350 to 1000 degrees C. Moreover, an electrode 16 having the same size as the wafer W is buried above the heater 14 in the mounting table 2. A high-frequency bias power supply 19 is electrically connected to the electrode 16. A high-frequency bias for implanting ions is applied from the high-frequency bias power supply 19 to the mounting table 2. The high-frequency bias power supply 19 may not be provided depending on the characteristics of plasma processing.

The microwave introduction mechanism 3 includes a planar slot antenna 21 provided so as to face an opening at the top of the processing container 1 and having a large number of slots 21*a*, a microwave generator 22 configured to generate a microwaves, and a microwave transmission mechanism 23 configured to guide the microwaves from the microwave generator 22 to the planar slot antenna 21. A microwave transmitting plate 24 made of a dielectric material is provided below the planar slot antenna 21 so as to be supported by an upper plate 32 provided in an ring shape in the upper portion of the processing container 1. A water-cooled shielding member 25 is provided above the planar slot antenna 21. In addition, a retardation member 26 is provided between the shielding member 25 and the planar slot antenna 21.

The planar slot antenna 21 is composed of, for example, a copper or aluminum plate whose surface is plated with silver or gold, and is configured such that a plurality of slots 21*a* for radiating a microwaves is formed to penetrate the planar slot antenna 21 in a predetermined pattern. The pattern of the slots 21*a* is appropriately set so that the microwaves are evenly radiated. An example of a suitable pattern is a radial line slot in which plural pairs of slots 21*a* each including two slots 21*a* arranged in a T shape are concentrically arranged. The length and arrangement interval of the slots 21*a* are appropriately determined according to the effective wavelength ($\lambda$g) of the microwaves. The slots 21*a* may have another shape such as a circular shape, an arc shape or the like. Furthermore, the arrangement form of the slots 21*a* is not particularly limited. The slots 21*a* may be arranged not only in a concentric shape but also in, for example, a spiral shape or a radial shape. The pattern of the slots 21*a* is appropriately set so as to realize microwave radiation characteristics capable of obtaining a desired plasma density distribution.

The retardation member 26 is made of a dielectric material having a dielectric constant larger than that of vacuum, for example, quartz, ceramics ($Al_2O_3$), or a resin such as polytetrafluoroethylene, polyimide or the like. The retardation member 26 has a function of making the wavelength of microwaves shorter than that in the vacuum to reduce the size of the planar slot antenna 21. The microwave transmitting plate 24 is also made of the same dielectric material.

The thicknesses of the microwave transmitting plate 24 and the retardation member 26 are adjusted so that the equivalent circuit formed by the retardation member 26, the planar slot antenna 21, the microwave transmitting plate 24 and the plasma satisfies a resonance condition. By adjusting the thickness of the retardation member 26, it is possible to adjust the phase of the microwaves. By adjusting the thickness so that the junction of the planar slot antenna 21 becomes a "belly" of a standing wave, the microwave reflection is minimized and the microwave radiant energy is maximized. By making the retardation member 26 and the microwave transmitting plate 24 from the same material, it is possible to prevent interface reflection of microwaves.

The microwave generator 22 includes a microwave oscillator. The microwave oscillator may be a magnetron or a solid state. The frequency of the microwaves generated from the microwave oscillator may be in a range of 300 MHz to 10 GHz. For example, by using a magnetron as the microwave oscillator, it is possible to generate microwaves having a frequency of 2.45 GHz.

The microwave transmission mechanism 23 includes a waveguide 27 extending in the horizontal direction to guide the microwaves from the microwave generator 22, a coaxial waveguide 28 composed of an inner conductor 29 extending upward from the center of the planar slot antenna 21 and an outer conductor 30 disposed on the outer side of the inner conductor 29, and a mode conversion mechanism 31 provided between the waveguide 27 and the coaxial waveguide 28. The microwaves generated in the microwave generator 22 propagates propagate through the waveguide 27 in a TE mode, and then the vibration mode of the microwaves is converted from the TE mode to a TEM mode by the mode conversion mechanism 31. After that, the microwaves are guided to the retardation member 26 via the coaxial waveguide 28 and are radiated from the retardation member 26 into the processing container 1 via the slots 21*a* of the planar slot antenna 21 and the microwave transmitting plate 24. A tuner (not shown) for matching the impedance of the load (plasma) in the processing container 1 to the characteristic impedance of the power source of the microwave generator 22 is provided in the middle of the waveguide 27.

The gas supply mechanism 4 includes a shower plate 41 provided horizontally at a position above the mounting table in the processing container 1 so as to partition an upper space and a lower space, and a shower ring 42 provided in a ring shape along the inner wall of the processing container 1 at a position above the shower plate 41.

The shower plate 41 includes a gas flow member 51 formed in a lattice shape, a gas flow path 52 provided in a lattice shape inside the gas flow member 51, and a plurality of gas discharge holes 53 extending downward from the gas flow path 52. Gaps formed in the lattice-like gas flow member 51 are through holes 54. A gas supply path 55 reaching the outer wall of the processing container 1 extends in the gas flow path 52 of the shower plate 41, and a gas supply pipe 56 is connected to the gas supply path 55. This gas supply pipe 56 is branched into three branch pipes 56*a*, 56*b* and 56*c*. An $H_2$ gas supply source 57 for supplying an $H_2$ gas as a reducing gas, a $C_2H_4$ gas supply source 58 for supplying an ethylene ($C_2H_4$) gas as a carbon-containing gas which is a film-forming raw material gas, and an $N_2$ gas supply source 59 for supplying an $N_2$ gas used as a purge gas or the like are respectively connected to the branch pipes 56*a*, 56*b* and 56*c*. Although not shown, a mass flow controller for flow rate control and valves existing before and after the mass flow controller are provided in each of the branch pipes 56*a*, 56*b* and 56*c*.

The shower ring 42 includes a ring-shaped gas flow path 66 provided in the shower ring 42 and a large number of gas discharge holes 67 connected to the gas flow path 66 and opened to an inner portion of the shower ring 42. A gas supply pipe 61 is connected to the gas flow path 66. The gas supply pipe 61 is branched into three branch pipes 61*a*, 61*b* and 61*c*. An Ar gas supply source 62 for supplying an Ar gas as a rare gas which is a plasma generation gas, an $O_2$ gas supply source 63 for supplying an $O_2$ gas as an oxidizing gas which is a cleaning gas, and an $N_2$ gas supply source 64 for supplying an $N_2$ gas used as a purge gas or the like are respectively connected to the branch pipes 61*a*, 61*b* and 61*c*. Although not shown, a mass flow controller for flow rate control and valves existing before and after the mass flow controller are provided in each of the branch pipes 61*a*, 61*b* and 61*c*.

The exhaust part 5 includes an exhaust chamber 11, an exhaust pipe 81 provided on a side surface of the exhaust chamber 11, and an exhaust device 82 connected to the exhaust pipe 81 and provided with a vacuum pump, a pressure control valve and the like.

The controller 6 is typically formed of a computer and is configured to control the respective parts of the processing apparatus 100. The controller 6 includes a memory part for storing a process sequence of the processing apparatus 100 and a process recipe which is a control parameter, an input part, a display and the like. The controller 6 performs predetermined controls according to a selected process recipe.

When forming a graphene structure according to the first embodiment by the processing apparatus 100 configured as described above, a target substrate, for example, a wafer W whose surface is made of an insulator, a semiconductor or a metal, is first loaded into the processing container 1 and is mounted on the mounting table 2. The surface of the wafer W is cleaned as necessary.

Preferred conditions for this surface treatment are as follows.
  Flow rate of Ar Gas: 0 to 2000 sccm
  Flow rate of $H_2$ Gas: 10 to 2000 sccm
  Pressure: 0.1 to 10 Torr (13.3 to 1333 Pa)
  Wafer temperature: 300 to 600 degrees C.
  Time: 10 to 120 min Next, the pressure inside the processing container 1 and the wafer temperature are controlled to predetermined values. In a state in which the surface of the wafer W does not have a catalytic function (in a state in which an activation treatment is not performed when the surface of the wafer W is a metal), a graphene structure is formed by remote microwave plasma CVD.

Specifically, while an Ar gas, which is a plasma generation gas, is supplied from the shower ring 42 to just below the microwave transmitting plate 24, the microwaves generated by the microwave generator 22 are guided to the retardation member 26 via the waveguide 27 of the microwave transmission mechanism 23, the mode conversion mechanism 31 and the coaxial waveguide 28. The microwaves are radiated from the retardation member 26 into the processing container 1 via the slots 21*a* of the planar slot antenna 21 and the microwave transmitting plate 24, and plasma is ignited. The microwaves spread as a surface wave to a region just under the microwave transmitting plate 24.

Surface wave plasma is generated by an Ar gas. This region where the surface wave plasma is generated becomes a plasma generation region. Then, at the timing when the plasma is ignited, a $C_2H_4$ gas as a carbon-containing gas, which is a film-forming raw material gas, and an $H_2$ gas as necessary are supplied from the shower plate 41. These gases are excited and dissociated by the plasma diffused from the plasma generation region and are supplied to the wafer W as a target substrate mounted on the mounting table 2 below the shower plate 41. The wafer W is located in a region distant from the plasma generation region, and the plasma diffused from the plasma generation region is supplied to the wafer W. Therefore, the plasma has a low electron temperature on the wafer W, thereby causing lower damage. Further, the high-density plasma mainly composed of radicals is generated. With such plasma, it is possible to cause the carbon-containing gas to react on the surface of the wafer, and it is possible to form a graphene structure having good crystallinity without having to use the activated metal catalyst layer which has been necessary in the related art.

At this time, the $C_2H_4$ gas as a carbon-containing gas and the $H_2$ gas as necessary are supplied from the shower plate 41 to below the plasma generation region and are dissociated by the diffused plasma. It is therefore possible to suppress excessive dissociation of these gases. However, these gases may be supplied to the plasma generation region. In addition, the Ar gas as a plasma generation gas may not be used. Plasma may be directly ignited by supplying the $C_2H_4$ gas as a carbon-containing gas and the $H_2$ gas to the plasma generation region.

Preferred conditions for remote microwave plasma CVD in the processing apparatus 100 are as follows.
  Gas flow rate:
    Ar gas: 0 to 2000 sccm
    Hydrocarbon gas ($C_2H_4$ gas in this example): 0.1 to 300 sccm
    $H_2$ gas: 0.01 to 500 sccm
  Pressure:
    When the wafer surface is insulator and semiconductor: 1.33 to 667 Pa (0.01 to 5 Torr)
    When the wafer surface is metal (with no catalytic function): 1.33 to 400 Pa (0.01 to 3 Torr)
  Temperature: 350 to 1000 degrees C. (more preferably 400 to 800 degrees C.)
  Microwave power: 100 to 5000 W (more preferably 1000 to 3500 W)
  Time: 1 to 200 min When the conditions are applied to the method of forming a graphene structure including CNW according to the second embodiment, the pressure is preferably in a low pressure range of 1.33 to 133 Pa (0.01 to 1 Torr). In this case, the surface of the wafer W is arbitrary. It is not excluded that the wafer W has a metal catalyst layer on a surface thereof and the remote microwave plasma CVD is performed after performing an activation treatment. In this case, the activation treatment is performed at a pressure of 66.7 to 400 Pa (0.5 to 3 Torr) and a temperature of 300 to 600 degrees C. for 0.5 to 30 minutes preferably by introducing a microwaves with a power of 250 to 4000 W while supplying an $H_2$ gas and an $N_2$ gas at a flow rate of, for example, 100 to 2000 sccm, respectively.

(Second Example of Processing Apparatus)

Figure 7:
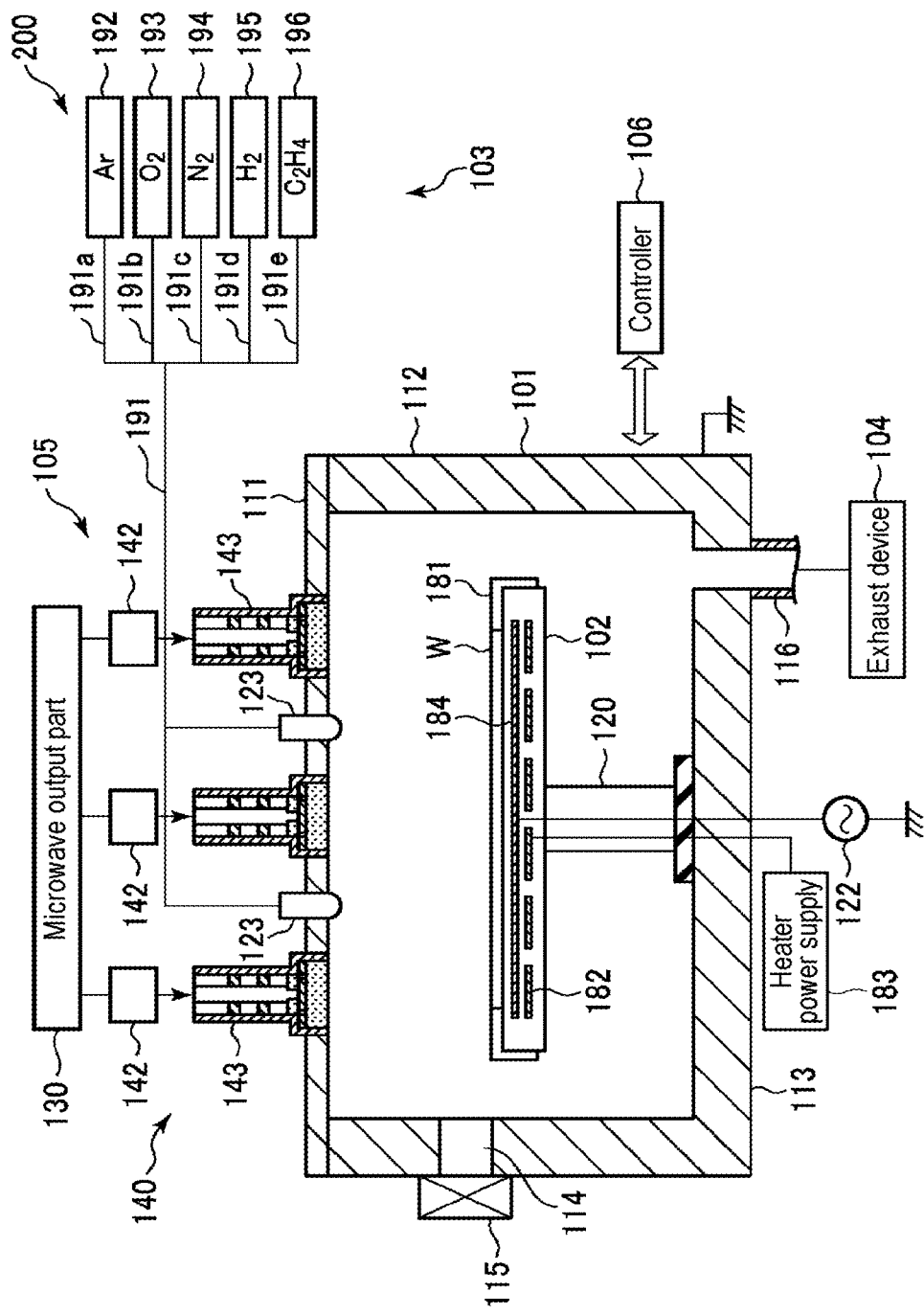
FIG. 7 is a sectional view showing a second example of a processing apparatus suitable for carrying out the graphene structure forming methods according to the first and second embodiments of the present disclosure.
Figure 8:
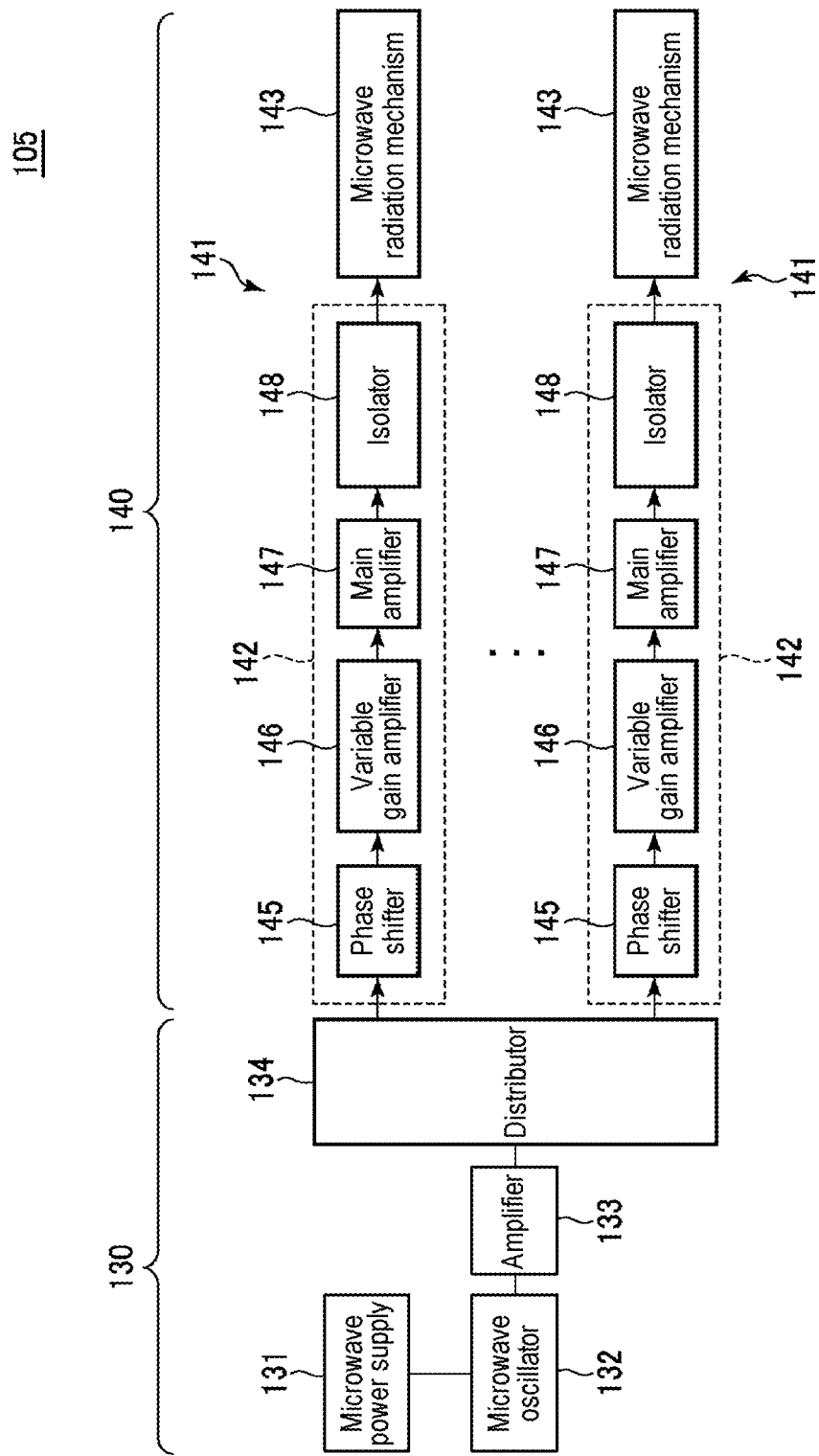
FIG. 8 is a configuration diagram showing a configuration of a microwave introduction device in the processing apparatus of FIG. 7.
Figure 9:
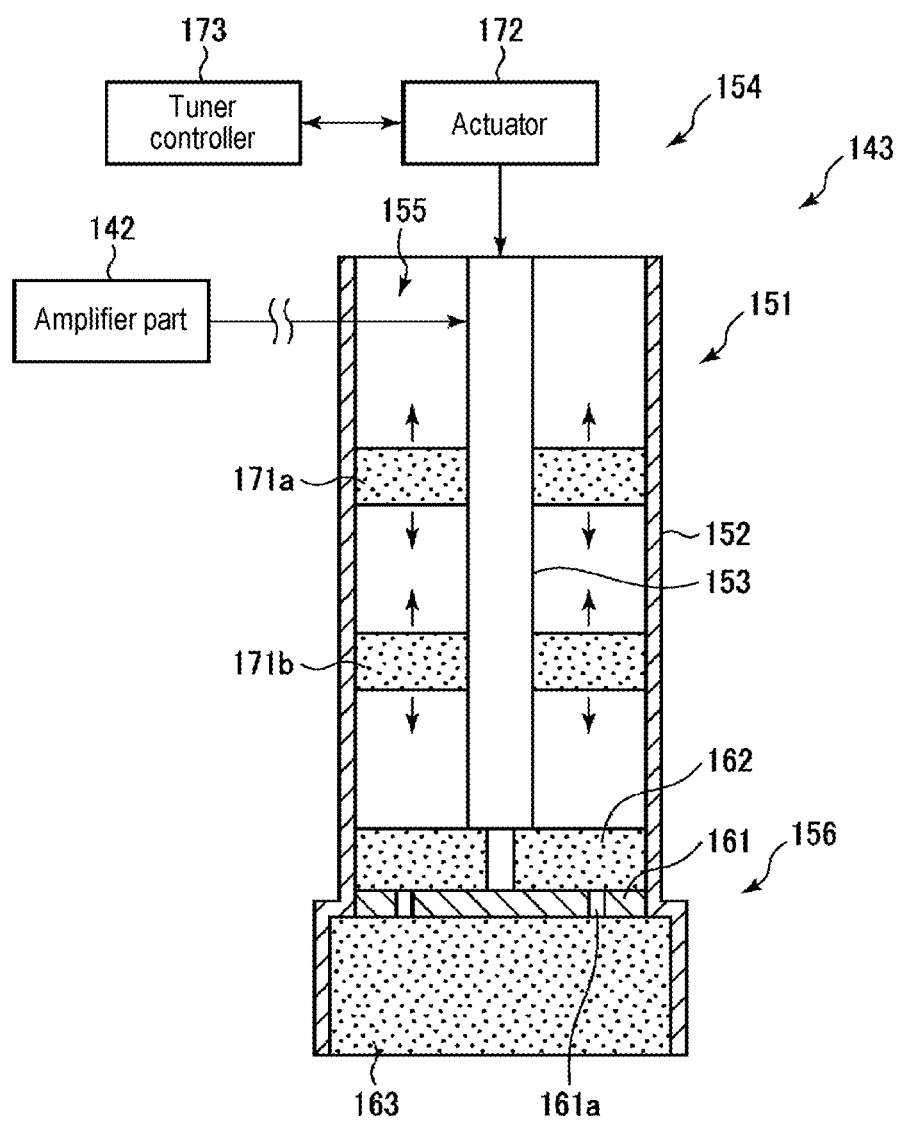
FIG. 9 is a sectional view schematically showing a microwave radiation mechanism in the processing apparatus of FIG. 7.
Figure 10:
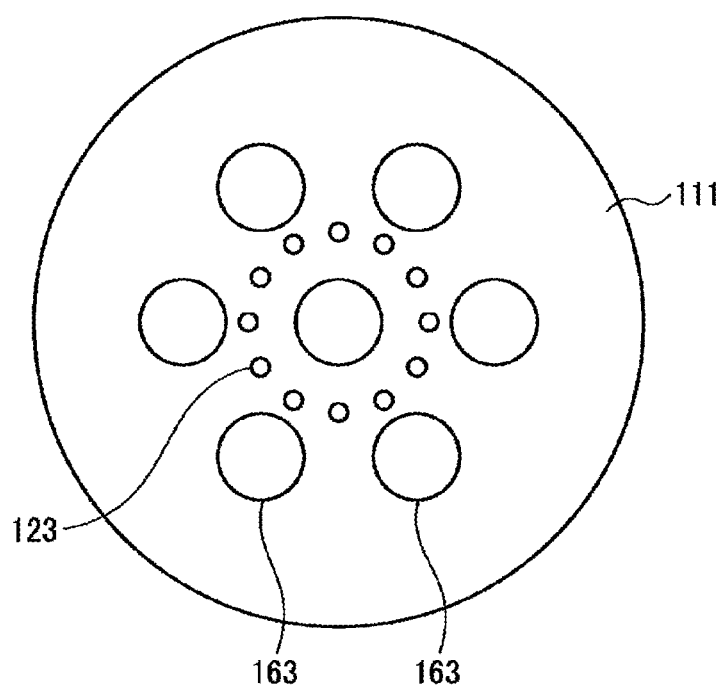
FIG. 10 is a bottom view schematically showing a ceiling wall portion of a processing container in the processing apparatus of FIG. 7.

FIG. 7 is a sectional view schematically showing a second example of the processing apparatus. FIG. 8 is a configuration diagram showing a configuration of a microwave introduction device of the processing apparatus of FIG. 7. FIG. 9 is a sectional view schematically showing a microwave radiation mechanism in the processing apparatus of FIG. 7. FIG. 10 is a bottom view schematically showing a ceiling wall portion of a processing container in the processing apparatus of FIG. 7.

The processing apparatus 200 includes a processing container 101 configured to accommodate a wafer W, a mounting table 102 disposed inside the processing container 101 and configured to mount the wafer W, a gas supply mechanism 103 configured to supply a gas into the processing container 101, an exhaust device 104 configured to exhaust the interior of the processing container 101, a microwave introduction device 105 configured to generate a microwaves for generating plasma inside the processing container 101 and to introduce the microwaves into the processing container 101, and a controller 106.

The processing container 101 is formed of, for example, a metallic material such as aluminum or its alloy, and has a substantially cylindrical shape. The processing container 101 includes a plate-like ceiling wall portion 111, a bottom wall portion 113, and a side wall portion 112 for connecting the ceiling wall portion 111 and the bottom wall portion 113. The microwave introduction device 105 is provided at the upper portion of the processing container 101 and serves as a plasma generator for generating plasma by introducing electromagnetic waves (microwaves) into the processing container 101. The microwave introduction device 105 will be described later in detail.

The ceiling wall portion 111 has a plurality of openings into which a below-described microwave radiation mechanism of the microwave introduction device 105 and a gas introduction part are fitted. The side wall portion 112 has a loading/unloading port 114 for loading and unloading the wafer W, which is a target substrate, with respect to a transfer chamber (not shown) adjacent to the processing container 101. The loading/unloading port 114 is opened and closed by a gate valve 115. An exhaust device 104 is provided in the bottom wall portion 113. The exhaust device 104 is provided in an exhaust pipe 116 connected to the bottom wall portion 113 and is provided with a vacuum pump and a pressure control valve. The interior of the processing container 101 is exhausted through the exhaust pipe 116 by the vacuum pump of the exhaust device 104. The pressure inside the processing container 101 is controlled by a pressure control valve.

The mounting table 102 has a disk shape and is made of a ceramic such as AlN or the like. The mounting table 102 is supported by a cylindrical support member 120 made of a ceramic such as AlN or the like and extending upward from the center of the bottom portion of the processing container 101. A guide ring 181 for guiding the wafer W is provided on the outer edge portion of the mounting table 102. Lift pins (not shown) for raising and lowering the wafer W is provided in the mounting table 102 so as to protrude and retract relative to the upper surface of the mounting table 102. Furthermore, a resistor heating type heater 182 is embedded in the mounting table 102. The heater 182 heats the wafer W on the mounting table 102 via the mounting table 102 by being supplied with electric power from a heater power supply 183. In addition, a thermocouple (not shown) is inserted in the mounting table 102. Based on a signal from the thermocouple, the heating temperature of the wafer W can be controlled to a predetermined temperature in a range of, for example, 350 to 1000 degrees C. Moreover, an electrode 184 having the same size as the wafer W is buried above the heater 182 in the mounting table 102. A high-frequency bias power supply 122 is electrically connected to the electrode 184. A high-frequency bias for implanting ions is applied from the high-frequency bias power supply 122 to the mounting table 102. The high-frequency bias power supply 122 may not be provided depending on the characteristics of plasma processing.

The gas supply mechanism 103 is configured to introduce a plasma generation gas and a raw material gas for forming a graphene structure into the processing container 101 and includes a plurality of gas introduction nozzles 123. The gas introduction nozzles 123 are fitted into the openings formed in the ceiling wall portion 111 of the processing container 101. A gas supply pipe 191 is connected to the gas introduction nozzles 123. The gas supply pipe 191 is branched into five branch pipes 191a, 191b, 191c, 191d and 191e. An Ar gas supply source 192 for supplying an Ar gas as a rare gas which is a plasma generation gas, an $O_2$ gas supply source 193 for supplying an $O_2$ gas as an oxidizing gas which is a cleaning gas, an $N_2$ gas supply source 194 for supplying an $N_2$ gas used as a purge gas or the like, an $H_2$ gas supply source 195 for supplying an $H_2$ gas as a reducing gas, and a $C_2H_4$ gas supply source 196 for supplying an ethylene ($C_2H_4$) gas as a carbon-containing gas which is a film-forming raw material gas are respectively connected to the branch pipes 191a, 191b, 191c, 191d and 191e. Although not shown, a mass flow controller for flow rate control and valves existing before and after the mass flow controller are provided in each of the branch pipes 191a, 191b, 191c, 191d and 191e. As in the first example, the dissociation of a gas may be adjusted by providing a shower plate so that the $C_2H_4$ gas and the $H_2$ gas can be supplied to a position close to the wafer W. The same effect can be obtained by causing the nozzles for supplying these gases to extend downward.

As described above, the microwave introduction device 105 is provided above the processing container 101 and serves as a plasma generator for generating plasma by introducing electromagnetic waves (microwaves) into the processing container 101. As shown in FIGS. 7 and 8, the microwave introduction device 105 includes a ceiling wall portion 111 of the processing container 101 functioning as a ceiling plate, a microwave output part 130 configured to generate microwaves and to distribute and output the microwaves to a plurality of paths, and an antenna unit 140 configured to introduce the microwaves outputted from the microwave output part 130 into the processing container 101.

The microwave output part 130 includes a microwave power supply 131, a microwave oscillator 132, an amplifier 133 configured to amplify the microwaves generated by the microwave oscillator 132, and a distributor 134 configured to distribute the microwaves amplified by the amplifier 133 to a plurality of paths. The microwave oscillator 132 is a solid state and is configured to generate microwaves (for example, PLL oscillate) at, for example, 860 MHz. The frequency of the microwaves is not limited to 860 MHz, and may be in a range of 700 MHz to 10 GHz such as 2.45 GHz, 8.35 GHz, 5.8 GHz, 1.98 GHz, or the like. The distributor 134 distributes the microwaves while matching the impedances on the input side and the output side.

The antenna unit 140 includes a plurality of antenna modules 141. Each of the antenna modules 141 introduces the microwaves distributed by the distributor 134 into the processing container 101. The configurations of the antenna modules 141 are the same. Each of the antenna modules 141 includes an amplifier part 142 configured to mainly amplify and output the distributed microwaves, and a microwave radiation mechanism 143 configured to radiate the microwave outputted from the amplifier part 142 into the processing container 101.

The amplifier part 142 includes a phase shifter 145 configured to change the phase of the microwaves, a variable gain amplifier 146 configured to adjust the power level of the microwaves inputted to a main amplifier 147, a main amplifier 147 configured as a solid state amplifier, and an isolator 148 configured to isolate a reflected microwave reflected by the antenna unit of the below-described microwave radiation mechanism 143 and moved toward the main amplifier 147.

As shown in FIG. 7, a plurality of microwave radiation mechanisms 143 is provided in the ceiling wall portion 111. Further, as shown in FIG. 9, each of the microwave radiation mechanisms 143 includes a coaxial tube 151 having a tubular outer conductor 152, an inner conductor 153 provided coaxially with the outer conductor 152 inside the outer conductor 152 and a microwave transmission line provided between the outer conductor 152 and the inner conductor 153, a feeder part 155 configured to feed the amplified microwave from the amplifier part 142 to the microwave transmission line, a tuner 154 configured to match the load impedance with the characteristic impedance of the microwave power supply 131, and an antenna part 156 configured to radiate a microwave from the coaxial tube 151 into the processing container 101.

The feeder part 155 introduces the microwaves amplified by the amplifier part 142 from the side of the upper end portion of the outer conductor 152 by the coaxial cable. For example, by radiating the microwave with a feeder antenna, the microwave power is fed to the microwave transmission line between the outer conductor 152 and the inner conductor 153. The microwave power is propagated toward the antenna part 156.

The antenna part 156 is provided at the lower end portion of the coaxial tube 151. The antenna part 156 includes a disk-like planar slot antenna 161 connected to the lower end portion of the inner conductor 153, a retardation member 162 disposed on the upper surface side of the planar slot antenna 161, and a microwave transmitting plate 163 disposed on the lower surface side of the planar slot antenna 161. The microwave transmitting plate 163 is fitted in the ceiling wall portion 111, and the lower surface thereof is exposed to the internal space of the processing container 101. The planar slot antenna 161 has slots 161a formed so as to penetrate therethrough. The shape of the slots 161a is appropriately set so that the microwaves can be radiated efficiently. A dielectric material may be inserted into the slots 161a. The retardation member 162 is made of a material having a dielectric constant larger than that of vacuum. The phase of the microwaves may be adjusted by the thickness of the retardation member 162 so that the radiant energy of the microwaves can be maximized. The microwave transmitting plate 163 is also made of a dielectric material and has such a shape that the microwaves can be efficiently radiated in a TE mode. Then, the microwaves transmitted through the microwave transmitting plate 163 generate plasma in the space inside the processing container 101. As the material constituting the retardation member 162 and the microwave transmitting plate 163, it may be possible to use, for example, quartz, ceramics, a fluorine-based resin such as a polytetrafluoroethylene resin or the like, a polyimide resin, and the like.

The tuner 154 constitutes a slug tuner. As shown in FIG. 9, the tuner 154 includes two slugs 171a and 171b disposed on the base end side (upper end side) portion of the coaxial tube 151 with respect to the antenna part 156, an actuator 172 configured to independently drive the two slugs 171a and 171b, and a tuner controller 173 configured to control the actuator 172.

The slugs 171a and 171b, which have a plate-like annular shape, are made of a dielectric material such as ceramics or the like and are disposed between the outer conductor 152 and the inner conductor 153 of the coaxial tube 151. The actuator 172 individually drives the slugs 171a and 171b, for example, by rotating the two screws provided inside the inner conductor 153 and threadedly coupled by the slugs 171a and 171b. Based on a command from the tuner controller 173, the actuator 172 moves the slugs 171a and 171b in the vertical direction. The tuner controller 173 adjusts the positions of the slugs 171a and 171b so that the impedance of the terminal portion becomes 50Ω.

The main amplifier 147, the tuner 154 and the planar slot antenna 161 are arranged close to each other. The tuner 154 and the planar slot antenna 161 constitute a lumped constant circuit and serve as a resonator. Impedance mismatch exists in the mounting portion of the planar slot antenna 161. However, tuning is directly performed by the tuner 154 with respect to the plasma load. Therefore, it is possible to perform tuning with high precision including plasma and to eliminate the influence of reflection in the planar slot antenna 161.

As shown in FIG. 10, in this example, seven microwave radiation mechanisms 143 are provided, and the microwave transmitting plates 163 corresponding thereto are equally arranged so as to have a hexagonal close-packed arrangement. That is, one of the seven microwave transmitting plates 163 is disposed at the center of the ceiling wall portion 111, and the remaining six microwave transmitting plates 163 are disposed around the microwave transmitting plate 163 disposed at the center. These seven microwave transmitting plates 163 are arranged so that adjacent microwave transmitting plates are arranged at equal intervals. In addition, the plurality of gas introduction nozzles 123 of the gas supply mechanism 103 are arranged so as to surround the periphery of the central microwave transmitting plate 163. The number of microwave radiation mechanisms 143 is not limited to seven.

The controller 106 is typically formed of a computer and is configured to control the respective parts of the processing apparatus 200. The controller 106 includes a memory part for storing a process sequence of the processing apparatus 200 and a process recipe which is a control parameter, an input part, a display and the like. The controller 106 performs predetermined controls according to a selected process recipe.

When forming a graphene structure according to the first embodiment by the processing apparatus 200 configured as described above, a target substrate, for example, a wafer W whose surface is made of an insulator, a semiconductor or a metal, is first loaded and mounted on the mounting table 102. The surface of the wafer W is cleaned as necessary.

Preferred conditions for this surface treatment are as follows.

Gas flow rate of Ar: 0 to 2000 sccm
Gas flow rate of $H_2$: 10 to 2000 sccm
Pressure: 0.1 to 10 Torr (13.3 to 1333 Pa)
Wafer temperature: 300 to 600 degrees C.
Time: 10 to 120 min Next, the pressure inside the processing container 101 and the wafer temperature are controlled to predetermined values. In a state in which the surface of the wafer W does not have a catalytic function (in a state in which an activation treatment is not performed when the surface of the wafer W is a metal), a graphene structure is formed by remote microwave plasma CVD.

Specifically, an Ar gas, which is a plasma generation gas, is supplied from the gas introduction nozzle 123 to just below the ceiling wall portion 111 of the processing container 101. The microwaves distributed and outputted from the microwave output part 130 of the microwave introduction device 105 are guided to the plurality of antenna modules 141 of the antenna unit 140 and radiated from the microwave radiation mechanisms 143 to ignite the plasma.

In each antenna module 141, the microwaves are individually amplified by the main amplifier 147 constituting the solid state amplifier and are fed to each microwave radiation mechanism 143. The microwaves propagate through the coaxial tube 151 and reaches the antenna part 156. At that time, the impedance of the microwaves is automatically matched by the slug 171a and the slug 171b of the tuner 154. In a state in which there is substantially no power reflection, the microwaves are transmitted from the tuner 154 through the retardation member 162 of the antenna part 156 and are radiated from the slots 161a of the planar slot antenna 161. The microwaves further pass through the microwave transmitting plate 163 and propagate through the surface (lower surface) of the microwave transmitting plate 163 in contact with the plasma, thereby forming a surface wave. Then, the power from each antenna part 156 is space-synthesized in the processing container 101. Surface wave plasma is generated by an Ar gas in a region just under the ceiling wall portion 111. This region becomes a plasma generation region.

Then, at the timing when the plasma is ignited, a $C_2H_4$ gas as a carbon-containing gas, which is a film-forming raw material gas, and an $H_2$ gas as necessary are supplied from the gas introduction nozzle 123. These gases are excited and dissociated by the plasma and are supplied to the wafer W as a target substrate mounted on the mounting table 102. The wafer W is located in a region distant from the plasma generation region, and the plasma diffused from the plasma generation region is supplied to the wafer W. Therefore, the plasma has a low electron temperature on the wafer W, thereby causing lower damage, and the high-density plasma mainly composed of radicals is generated. With such plasma, it is possible to cause the carbon-containing gas to react on the surface of the wafer, and it is possible to form a graphene structure having good crystallinity without having to use the activated metal catalyst layer which has been necessary in the related art.

In this example, the $C_2H_4$ gas as a carbon-containing gas and the $H_2$ gas as necessary are supplied to the plasma generation region and are dissociated by the plasma. However, the same shower plate as in the first example may be used or the gas introduction nozzle may be extended. Dissociation may be suppressed by dissociating the $C_2H_4$ gas and optionally the $H_2$ gas with the plasma diffused from the plasma generation region. In addition, the Ar gas as a plasma generation gas may not be used. Plasma may be directly ignited by supplying the $C_2H_4$ gas as a carbon-containing gas and the $H_2$ gas to the plasma generation region.

In the processing apparatus 200 of this example, the microwaves distributed to a plurality of regions are individually amplified by the main amplifier 147 constituting the solid state amplifier and are individually introduced from the plurality of antenna parts 156 into the processing container 101 to form a surface wave. Thereafter, the microwaves are synthesized in a space to generate microwave plasma. Therefore, a large isolator or a large synthesizer is not necessary and the processing apparatus 200 is compact. Further, the main amplifier 147, the tuner 154 and the planar slot antenna 161 are provided close to each other. The tuner 154 and the planar slot antenna 161 constitute a lumped constant circuit and serve as a resonator. Therefore, at the planar slot antenna attachment portion where an impedance mismatch exists, tuning can be performed with high accuracy including the plasma by the tuner 154. This makes it possible to reliably eliminate the influence of reflection and to control the plasma with high accuracy. In addition, since a plurality of microwave transmitting plates 163 is provided, the total area can be made smaller than in the single microwave transmitting plate 24 of the processing apparatus of the first example. This makes it possible to reduce the power of the microwaves necessary for stably igniting and discharging plasma.

Preferred conditions for the remote microwave plasma CVD in the processing apparatus 200 are basically the same as those of the first example. However, more preferable conditions may vary depending on items. The preferred conditions are as follows.

Gas flow rate
    Ar gas: 0 to 2000 sccm
    Hydrocarbon gas ($C_2H_4$ gas in this example): 0.1 to 300 sccm
    $H_2$ gas: 0.01 to 500 sccm Pressure:
    When the wafer surface is insulator and semiconductor: 1.33 to 667 Pa (0.01 to 5 Torr),
    When the wafer surface is metal (with no catalytic function): 1.33 to 400 Pa (0.01 to 3 Torr)

Temperature: 350 to 1000 degrees C. (more preferably 400 to 800 degrees C.)

Microwave power: 100 to 5000 W (more preferably 1000 to 3500 W) in total

Time: 1 to 200 min

Even in the processing apparatus of this example, when applied to the method of forming a graphene structure including CNW according to the second embodiment, the pressure is preferably in a low pressure range of 1.33 to 133 Pa (0.01 to 1 Torr). In this case, the surface of the wafer W is arbitrary. It is not excluded that the wafer W has a metal catalyst layer on a surface thereof and the remote microwave plasma CVD is performed after performing an activation treatment. In this case, as in the first example, the activation treatment is performed at a pressure of 66.7 to 400 Pa (0.5 to 3 Torr) and a temperature of 300 to 600 degrees C. for 0.5 to 30 minutes preferably by introducing a microwave with a total power of 250 to 4000 W while supplying an $H_2$ gas and an $N_2$ gas at a flow rate of, for example, 100 to 2000 sccm, respectively.

<Other Applications>

While the embodiments of the present disclosure have been described above, the present disclosure is not limited to the above-described embodiments. Various modifications may be made without departing from the scope of the present disclosure.

For example, the processing apparatus for performing the remote microwave plasma CVD used in the above embodiments is nothing more than an example. Various types of processing apparatuses may be used.

In addition, although a semiconductor wafer based on a semiconductor substrate such as Si or the like has been described as an example of a target substrate for forming a graphene structure, the present disclosure is not limited thereto.

EXAMPLES

Hereinafter, examples of the present disclosure will be described.

Example 1

Figure 11:
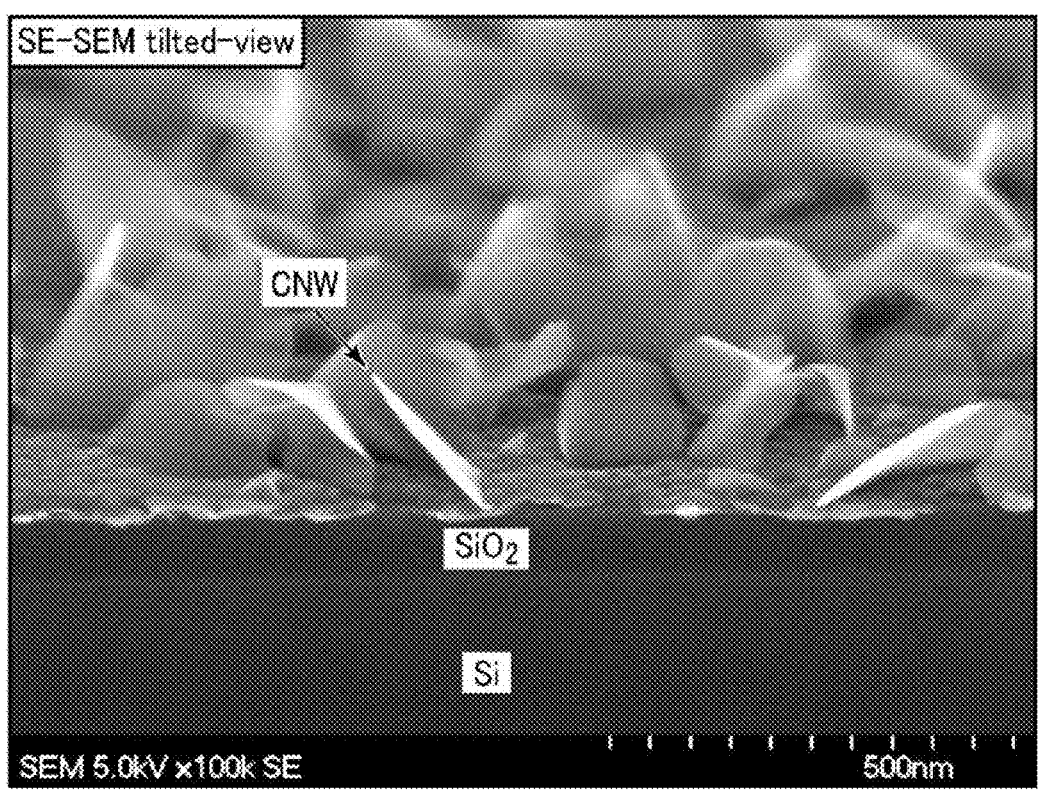
FIG. 11 is an SEM photograph showing a graphene structure formed in Example 1.
Figure 12:
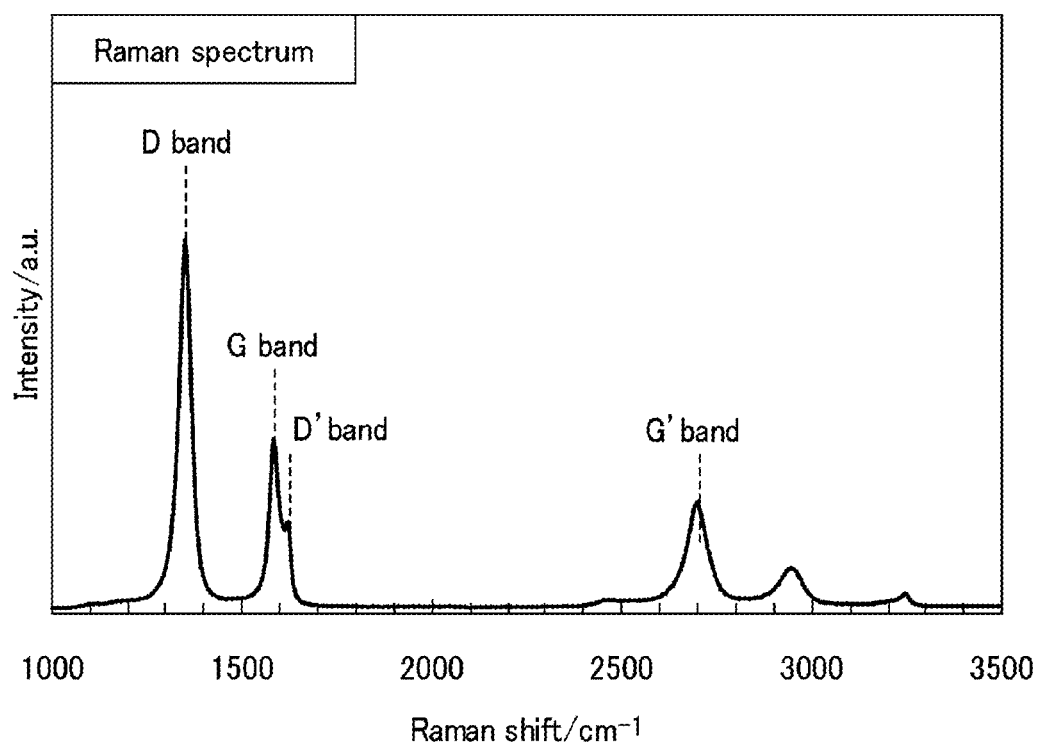
FIG. 12 is a diagram showing a Raman spectrum of the graphene structure formed in Example 1.

In this example, as a target substrate, a wafer (without a metal catalyst layer) having an $SiO_2$ film formed on a Si base was prepared. Using the processing apparatus of the first example, remote microwave plasma CVD was performed under the conditions of an Ar gas flow rate of 500 sccm, a $C_2H_4$ gas flow rate of 20 sccm, a pressure of 0.05 Torr, a temperature of 530 degrees C., a microwave power of 2 kW and a time of 20 min. The SEM photograph at that time is shown in FIG. 11. As shown in this SEM photograph, it was confirmed that a graphene structure having graphene and CNW grows on the wafer whose surface is made of an insulator without using a catalyst. The Raman spectrum at this time is shown in FIG. 12. As shown in FIG. 12, a graphene-derived Raman signal was confirmed. The value of the ratio (G/D ratio) between a G band and a D band, which is an index of crystallinity, was 0.44. Similar to the aforementioned related art, this value is larger than the G/D ratio value of 0.35 known in the other related art relating to a technique in which CNW is formed by using a parallel flat plate type capacitively coupled plasma (CCP). It was confirmed that CNW having good crystallinity grows.

Example 2

Figure 13:
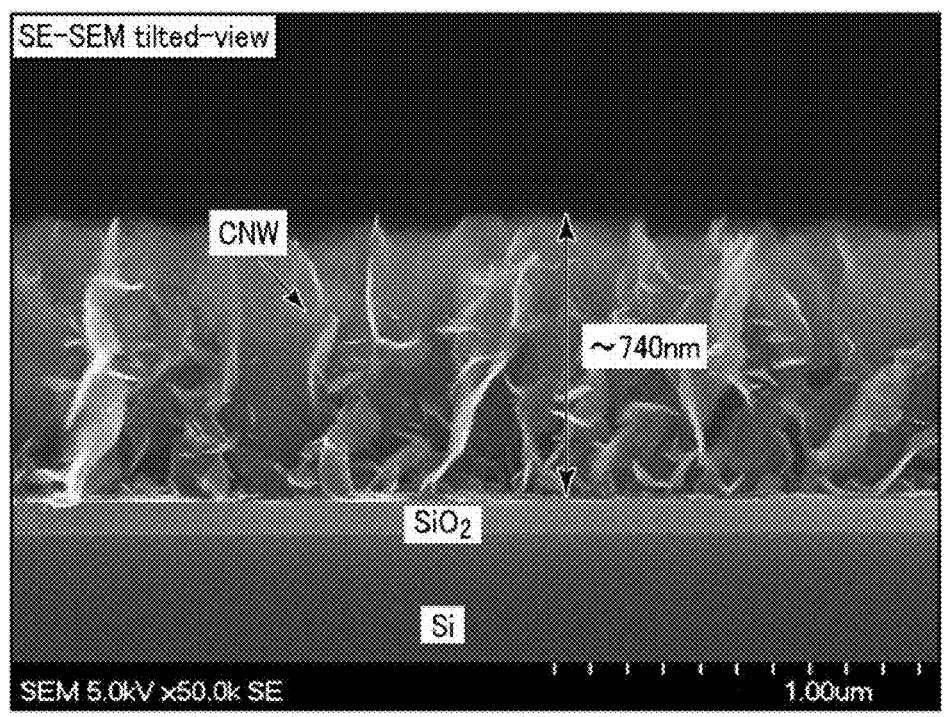
FIG. 13 is an SEM photograph showing a graphene structure formed in Example 2.

In this example, as in Example 1, as a target substrate, a wafer (without a metal catalyst layer) having an $SiO_2$ film formed on a Si base was prepared. Using the processing apparatus of the first example, remote microwave plasma CVD was performed under the conditions of an Ar gas flow rate of 500 sccm, a $C_2H_4$ gas flow rate of 20 sccm, a pressure of 0.05 Torr, a temperature of 510 degrees C., a microwave power of 3 kW and a time of 20 min. The SEM photograph at that time is shown in FIG. 13. As shown in FIG. 13, a graphene structure having graphene and CNW grows on the wafer. The thickness of CNW was approximately 740 nm. From this, it was confirmed that the growth rate of CNW is larger than 2 μm/h. In the aforementioned technique in which CNW is formed by using a parallel flat plate type capacitively coupled plasma (CCP), the growth rate of CNW is about 1.5 μm/h. Thus, it was confirmed that CNW can be formed at a higher growth rate than when a conventional technique is used.

Example 3

In this example, as in Example 1, as a target substrate, a wafer (without a metal catalyst layer) having an $SiO_2$ film formed on a Si base was prepared. Using the processing apparatus of the first example, remote microwave plasma CVD was performed under the conditions of an Ar gas flow rate of 500 sccm, a $C_2H_4$ gas flow rate of 20 sccm, a pressure of 0.05 Torr, a temperature of 530 degrees C., a microwave power of 2 kW and a time of 20 min. The SEM photographs at that time are shown in FIGS. 14A to 14D and 15A to 15D.

Figure 14A:
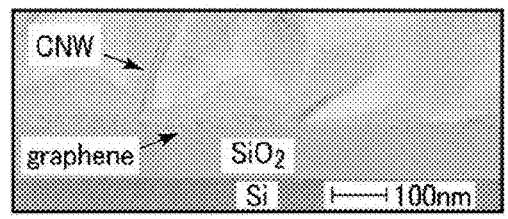
FIGS. 14A to 14D are TEM photographs showing a graphene structure formed in Example 3.
Figure 14B:
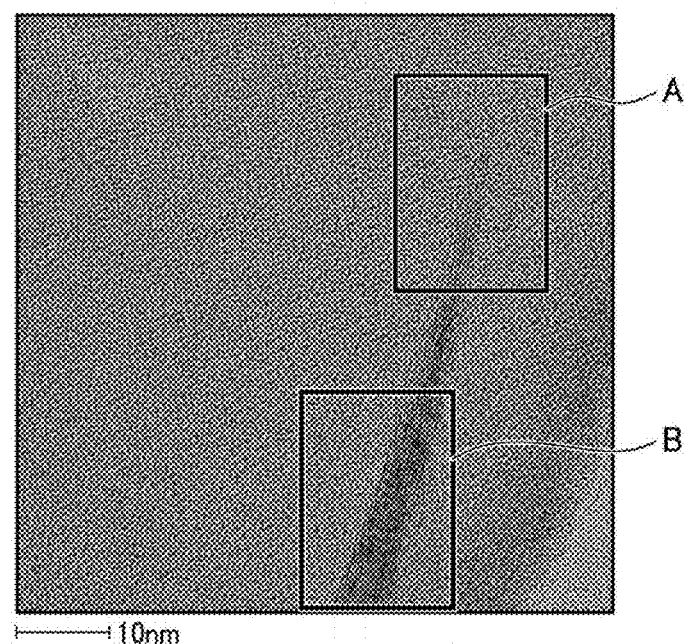
Figures 14C, 14D:
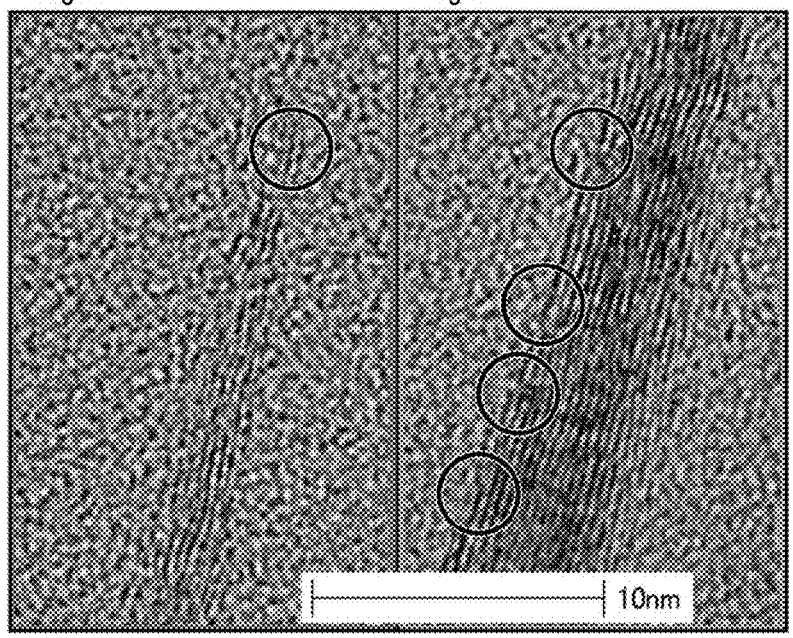

FIG. 14A shows that a graphene structure is growing on a wafer. FIG. 14B shows the CNW of the graphene structure on an enlarged scale. FIGS. 14C and 14D show an A region and a B region in FIG. 14B on a further enlarged scale. As shown in FIGS. 14A to 14D, it can be noted that graphene and CNW grow as a graphene structure and further that CNW is composed of plural layers of graphene sheets. In addition, it was confirmed that step edges exist in the graphene sheet constituting the CNW.

Figure 15A:
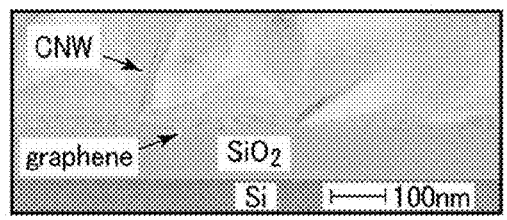
FIGS. 15A to 15D are TEM photographs showing a graphene structure formed in Example 3.
Figure 15B:
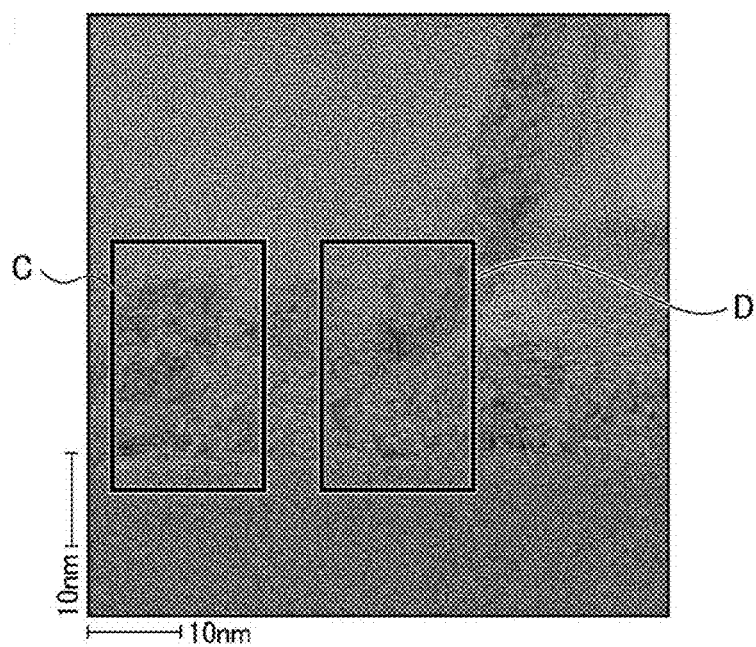
Figure 15C:
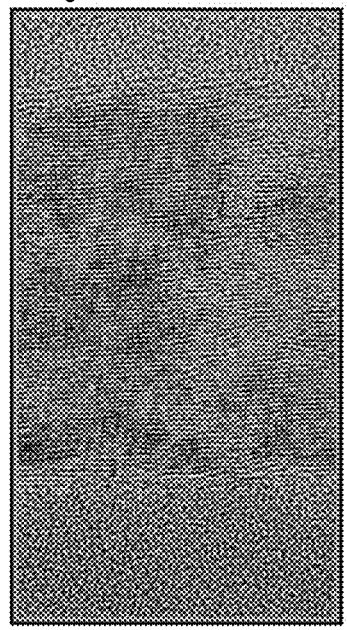
Figure 15D:
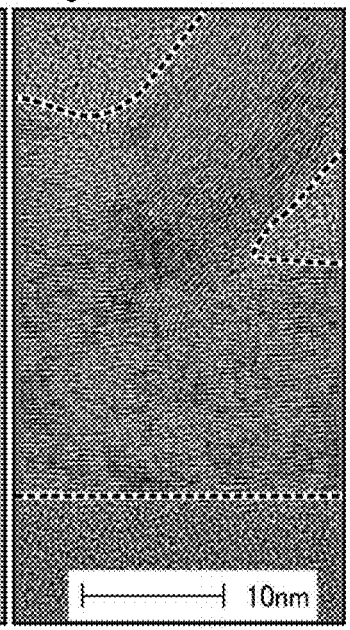

FIG. 15A shows that a graphene structure is growing on a wafer. FIG. 15B shows a graphene portion and a CNW portion of the graphene structure on an enlarged scale. FIGS. 15C and 15D show a C region and a D region in FIG. 15B on a further enlarged scale. As shown in FIGS. 15A to 15D, it can be noted that graphene grows on the wafer and CNW grows by branching from the graphene.

Example 4

In this example, the structure of a growing graphene structure was confirmed by changing processing conditions. As in Example 1, as a target substrate, a wafer (without a metal catalyst layer) having an $SiO_2$ film formed on a Si base was prepared. Using the processing apparatus of the first example, remote microwave plasma CVD was performed under the conditions (condition 1) of an Ar gas flow rate of 500 sccm, a $C_2H_4$ gas flow rate of 20 sccm, a pressure of 0.05 Torr, a temperature of 530 degrees C., a microwave power of 2 kW and a time of 20 min, and under the conditions (condition 2) of an Ar gas flow rate of 500 sccm, a $C_2H_4$ gas flow rate of 20 sccm, a pressure of 0.08 Torr, a temperature of 530 degrees C., a microwave power of 2 kW and a time of 80 min.

Figure 16A:
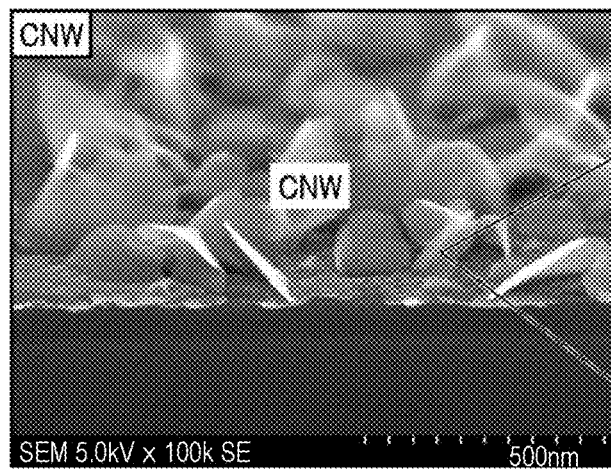
FIGS. 16A to 16C are views showing the results of processing under condition 1 in Example 4.
Figure 16B:
Figure 16C:
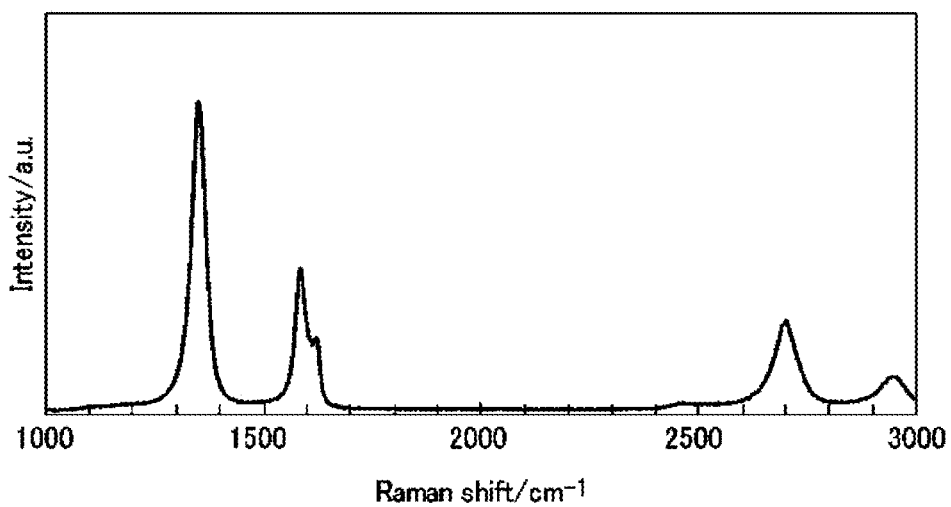

FIGS. 16A to 16C show the result of processing under condition 1. FIG. 16A is an SEM photograph at that time. From this SEM photograph, it can be seen that graphene and CNW grow as a graphene structure. FIG. 16B is a TEM photograph of the CNW contained in the graphene structure, which shows that the CNW is composed of a plurality of graphene sheets. FIG. 16C is the Raman spectrum of CNW, from which a graphene-derived Raman signal was confirmed.

Figure 17A:
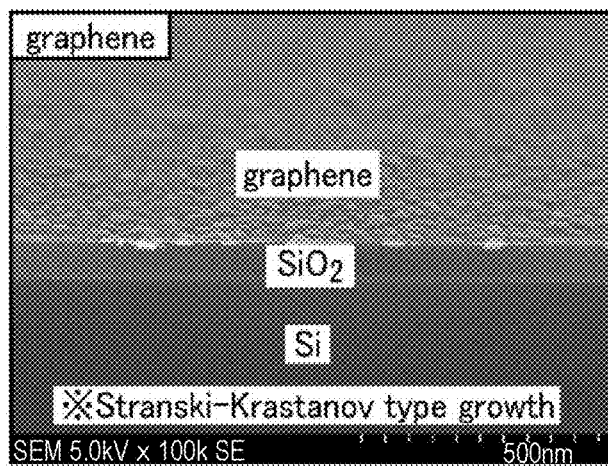
FIGS. 17A to 17C are views showing the results of processing under condition 2 in Example 4.
Figure 17B:
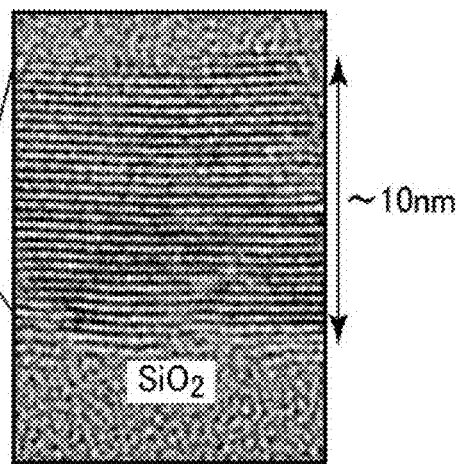
Figure 17C:
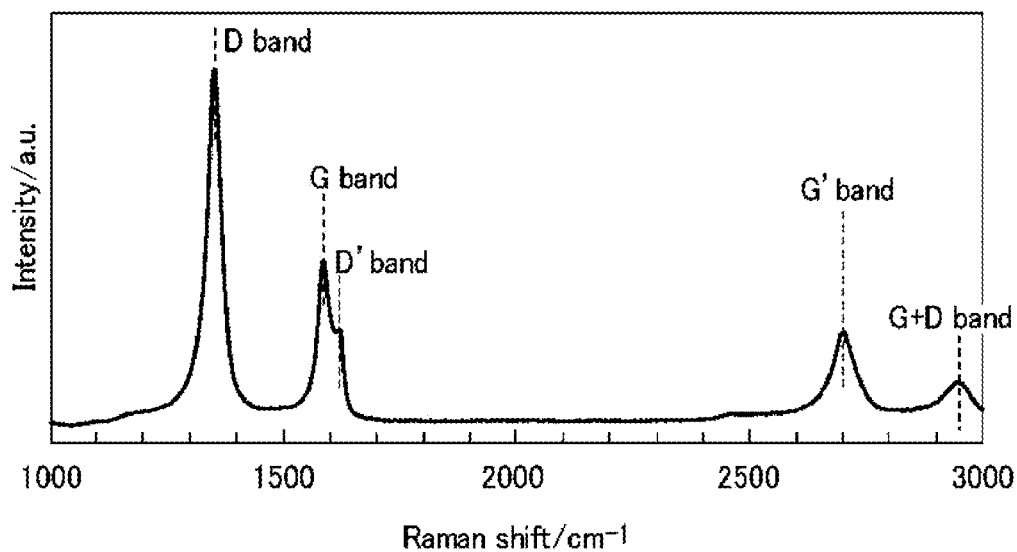

FIGS. 17A to 17C show the result of processing under condition 2. FIG. 17A is an SEM photograph at that time. From this SEM photograph, it can be seen that only graphene grows as a graphene structure. FIG. 17B is a TEM photograph of the graphene structure, which shows that a plurality of graphene sheets is stacked parallel to the wafer at a thickness of 10 nm. FIG. 17C is the Raman spectrum of the graphene structure, from which a graphene-derived Raman signal was confirmed.

From the above, it was also confirmed that CNW can be caused to grow by process tuning, or only graphene can be caused to grow by suppressing the growth of CNW.

Example 5

Figure 18:
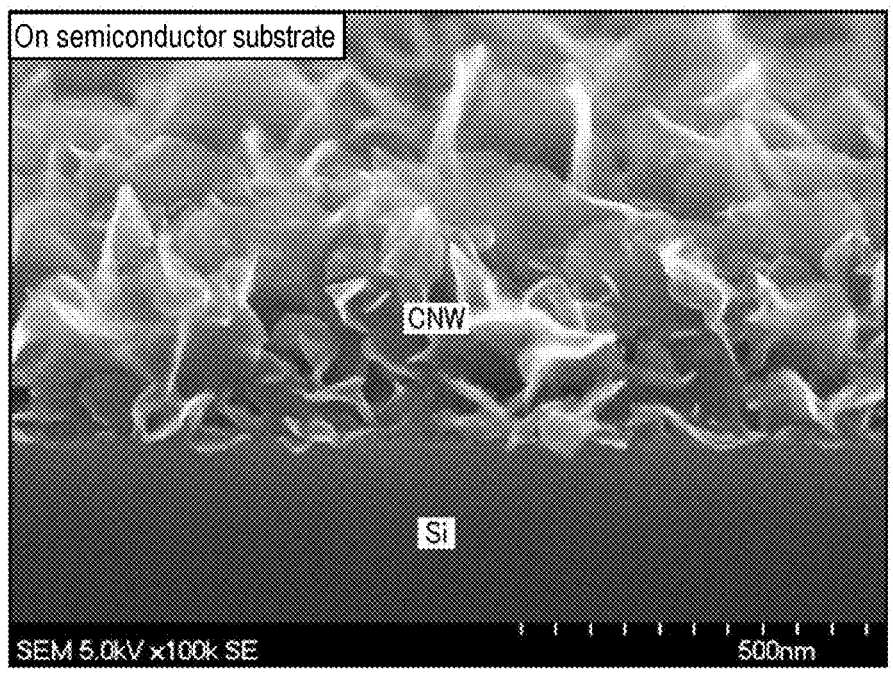
FIG. 18 is an SEM photograph showing a graphene structure formed in Example 5.

In this example, as a target substrate, a Si wafer (without a metal catalyst layer) was prepared. Using the processing apparatus of the first example, remote microwave plasma CVD was performed under the conditions of an Ar gas flow rate of 500 sccm, a $C_2H_4$ gas flow rate of 20 sccm, a pressure of 0.05 Torr, a temperature of 530 degrees C., a microwave power of 2 kW and a time of 20 min. The SEM photograph at that time is shown in FIG. 18. As shown in this SEM photograph, it was confirmed that a graphene structure including graphene and CNW grows on the Si wafer as a semiconductor without providing a catalyst.

Example 6

Figure 19:
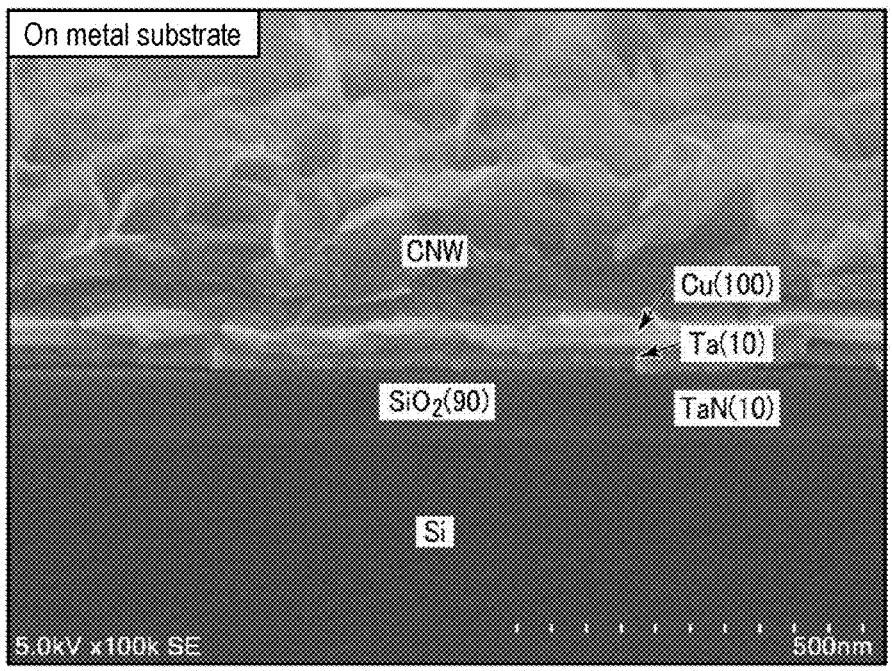
FIG. 19 is an SEM photograph showing a graphene structure formed in Example 6.

In this example, as a target substrate, a wafer obtained by sequentially forming an $SiO_2$ film, a TaN film, a Ta film and a Cu film on a Si base was prepared. Using the processing apparatus of the first example, without performing an activation treatment, remote microwave plasma CVD was performed under the conditions of an Ar gas flow rate of 500 sccm, a $C_2H_4$ gas flow rate of 20 sccm, a pressure of 0.02 Torr, a temperature of 510 degrees C., a microwave power of 2 kW and a time of 20 min. The SEM photograph at that time is shown in FIG. 19. As shown in this SEM photograph, it was confirmed that a graphene structure including graphene and CNW grows on the wafer having a metal surface without performing an activation treatment (without demonstrating a catalytic function).

Example 7

Figure 20A:
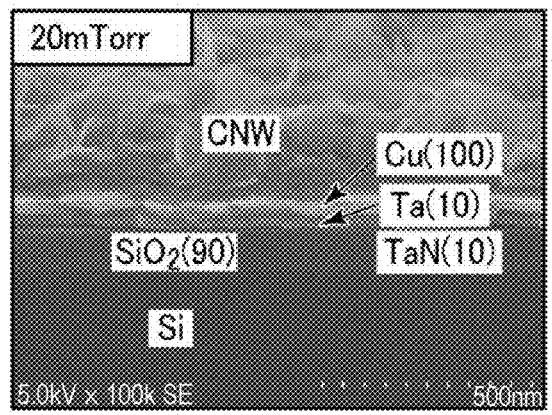
FIGS. 20A to 20D are SEM photographs showing graphene structures grown when a pressure is changed in Example 7.
Figure 20B:
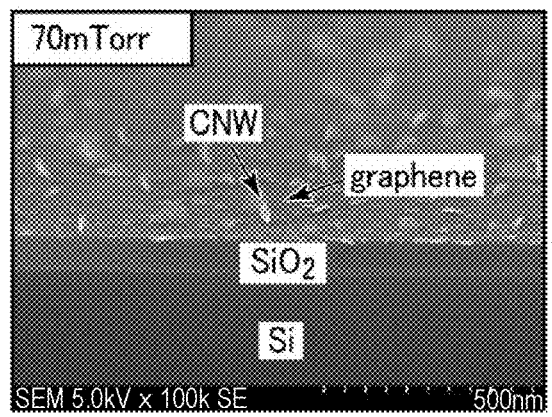
Figure 20C:
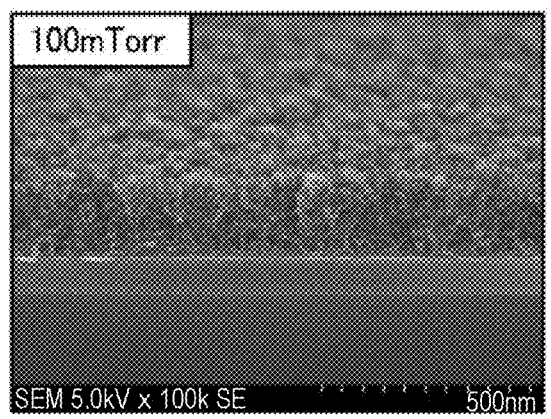
Figure 20D:
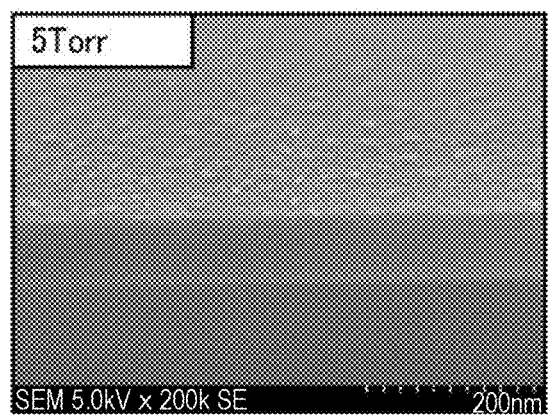

In this example, the state of the growing graphene structure was confirmed by changing the pressure. The results are shown in the SEM photographs of FIGS. 20A to 20D. FIG. 20A shows a case of 20 mTorr (lower limit pressure of plasma ignition), FIG. 20B shows a case of 70 mTorr, FIG. 20C shows a case of 100 mTorr, and FIG. 20D shows a case of 5 Torr. In FIG. 20A, the target substrate is a wafer whose surface is a metal as in Example 6. In FIGS. 20B and 20C, the target substrate is a wafer (without a metal catalyst layer) obtained by forming a $SiO_2$ film on a Si base. For other conditions, the conditions in FIGS. 20A and 20B are an Ar gas flow rate of 500 sccm, a $C_2H_4$ gas flow rate of 20 sccm, a temperature of 510 degrees C., a microwave power of 2 kW and a time of 20 min. The conditions in FIG. 20C are an Ar gas flow rate of 2000 sccm, a $C_2H_4$ gas flow rate of 1 to 10 sccm, a temperature of 530 degrees C., a microwave power of 2 kW and a time of 20 min. The conditions in FIG. 20D are an Ar gas flow rate of 2000 sccm, a $C_2H_4$ gas flow rate of 1 to 10 sccm, a temperature of 580 degrees C., a microwave power of 2 kW and a time of 20 min.

As shown in FIGS. 20A to 20D, it was confirmed that when the pressure is in the range of 20 mTorr to 5 Torr, the graphene structure can grow even though the density and form are changed. In addition, it was confirmed that when the pressure is 70 mTorr or lower, CNW grows. However, it was confirmed that when the pressure is than 100 mTorr or higher, only graphene grows.

Example 8

Figure 21:
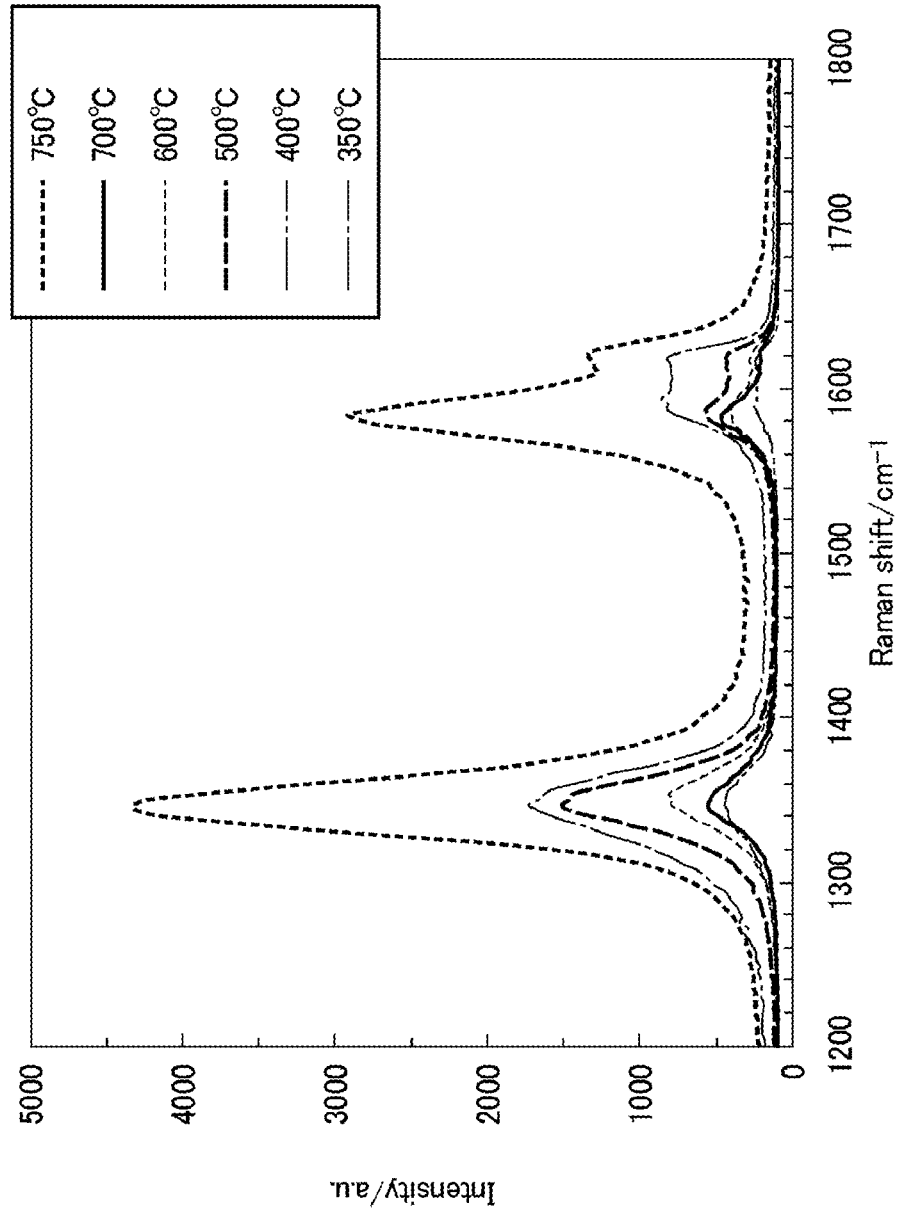
FIG. 21 is a diagram showing Raman spectra obtained when a remote microwave plasma CVD process is performed by changing a temperature in Example 8.

In this example, remote microwave plasma CVD was performed by changing the temperature. The Raman spectrum at that time is shown in FIG. 21. In this example, as a target substrate, a wafer (without a metal catalyst layer) having a $SiO_2$ film formed on a Si base was prepared. Other conditions were an Ar gas flow rate of 50 sccm, a $C_2H_4$ gas flow rate of 1 sccm, a pressure of 0.4 Torr, a microwave power of 425 W and a time of 10 min. As shown in FIG. 21, a graphene-derived Raman signal was confirmed at 350 to 750 degrees C. (upper limit temperature of wafer).

Example 9

Figure 22:
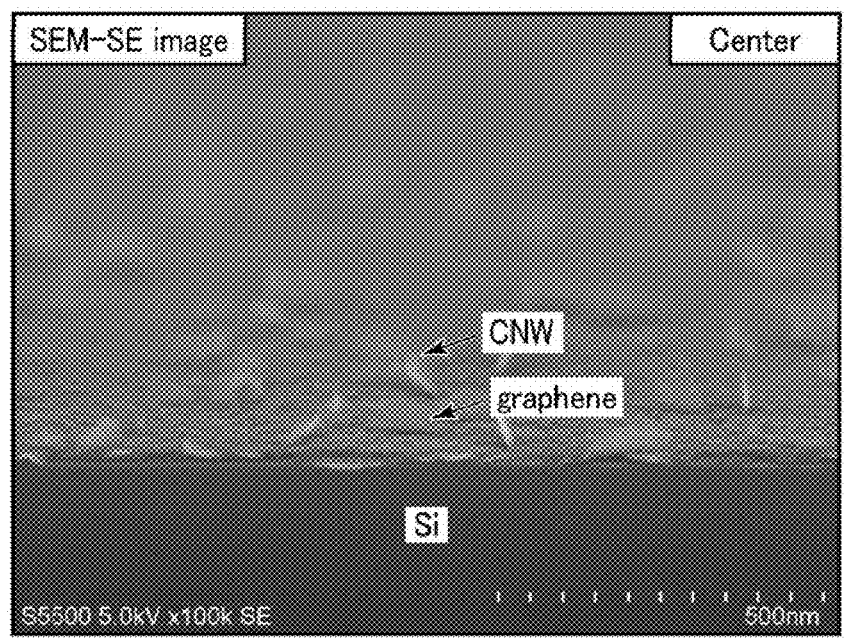
FIG. 22 is an SEM photograph showing a graphene structure formed in Example 9.
Figure 23:
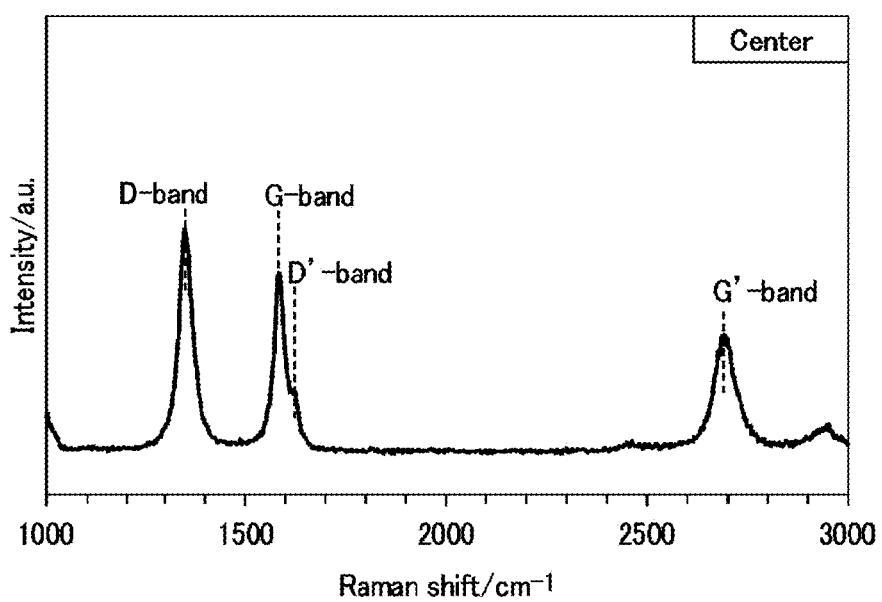
FIG. 23 is a diagram showing a Raman spectrum of the graphene structure formed in Example 9.

In this example, as a target substrate, a Si wafer (without a metal catalyst layer) was prepared. Using the processing apparatus of the second example, a pretreatment (surface treatment) was performed under the conditions of an Ar gas flow rate of 300 sccm, an $H_2$ gas flow rate of 50 sccm, a pressure of 1 Torr, a temperature of 700 degrees C., a microwave power (total sum) of 300 W and a time of 10 min. Thereafter, remote microwave plasma CVD was performed under the conditions of an Ar gas flow rate of 50 sccm, a $C_2H_4$ gas flow rate of 1 sccm, a pressure of 0.4 Torr, a temperature of 700 degrees C., a microwave power (total sum) of 425 W and a time of 10 min. The SEM photograph at that time is shown in FIG. 22. As shown in this SEM photograph, it was confirmed that a graphene structure including graphene and CNW grows on a Si wafer as a semiconductor without providing a catalyst. The Raman spectrum at this time is shown in FIG. 23. As shown in FIG. 23, a graphene-derived Raman signal was confirmed.

According to the first aspect of the present disclosure, in a state in which the surface of a target substrate does not have a catalytic function, a graphene structure is formed on the surface of the target substrate by remote microwave plasma CVD using a carbon-containing gas as a film-forming raw material gas. Therefore, it is possible to form a graphene structure without going through formation of a metal catalyst layer and activation of the metal catalyst layer.

According to the second aspect of the present disclosure, a graphene structure including a carbon nanowall is formed on the surface of a target substrate by remote microwave plasma CVD using a carbon-containing gas as a film-forming raw material gas. Therefore, it is possible to form a carbon nanowall which is less likely to be damaged by high-energy ions and which has good crystallinity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A graphene structure forming method comprising:
preparing a target substrate; and
forming a graphene structure on a surface of the target substrate by remote microwave plasma chemical vapor deposition (CVD) using a carbon-containing gas as a film-forming raw material gas in a state in which the surface of the target substrate has no catalytic function,
wherein the forming the graphene structure includes:
disposing the target substrate in a region spaced apart from a plasma generation region where the remote microwave plasma is generated;
generating the remote microwave plasma in the plasma generation region;
supplying the carbon-containing gas to a predetermined position between the plasma generation region and the target substrate such that the carbon-containing gas is dissociated by the remote microwave plasma; and
supplying the dissociated carbon-containing gas to the target substrate,
wherein the forming the graphene structure is performed by a processing apparatus, the processing apparatus including:
a processing container configured to accommodate the target substrate;
a mounting table configured to horizontally mount the target substrate inside the processing container;
a heating mechanism configured to heat the target substrate;
a microwave introduction device provided on the processing container;

a gas supply mechanism configured to supply a gas including the carbon-containing gas as the film-forming raw material gas into the processing container; and an exhaust mechanism configured to exhaust an interior of the processing container, wherein the microwave introduction device includes a microwave generator configured to generate microwaves, and a plurality of microwave radiation mechanisms supplied with the microwaves distributed from the microwave generator and configured to radiate the microwaves into the processing container, wherein each of the microwave radiation mechanisms includes a tuner configured to perform impedance matching, a planar slot antenna having slots configured to radiate the microwaves, and a microwave transmitting plate that is provided just below the planar slot antenna, fitted to a ceiling wall of the processing container and made of a dielectric material, wherein the gas supply mechanism supplies a rare gas as a plasma generation gas to the plasma generation region just below the ceiling wall of the processing container, and supplies the carbon-containing gas as the film-forming raw material gas from nozzles, which are fit into openings formed in the ceiling wall and extend downward from the ceiling wall, to the predetermined position between the ceiling wall and the target substrate on the mounting table, wherein the carbon-containing gas is a gas selected from a group consisting of ethylene ($C_2H_4$), methane ($CH_4$), ethane ($C_2H_6$), propane ($C_3H_8$), propylene ($C_3H_6$), acetylene ($C_2H_2$), methanol ($CH_3OH$), and ethanol ($C_2H_5OH$), and wherein the forming the graphene structure is performed under a pressure in a range of 100 mTorr to 5 Torr such that no carbon nanowall grows.

2. The method of claim 1, wherein the surface of the target substrate is an insulator or a semiconductor.

3. The method of claim 1, wherein the surface of the target substrate is a metal.

4. The method of claim 1, wherein the forming the graphene structure is performed under a temperature of the target substrate in a range of 350 to 1000 degrees C., a microwave power in a range of 100 to 5000 W and a time in a range of 1 to 200 min.

5. The method of claim 1, wherein the graphene structure is composed of only graphene formed parallel to the target substrate.

6. A graphene structure forming method comprising:
preparing a target substrate; and
forming a graphene structure on a surface of the target substrate by remote microwave plasma chemical vapor deposition (CVD) using a carbon-containing gas as a film-forming raw material gas,
wherein the forming the graphene structure includes:
disposing the target substrate in a region spaced apart from a plasma generation region where the remote microwave plasma is generated;
generating the remote microwave plasma in the plasma generation region;
supplying the carbon-containing gas to a predetermined position between the plasma generation region and the target substrate such that the carbon-containing gas is dissociated by the remote microwave plasma; and
supplying the dissociated carbon-containing gas to the target substrate,
wherein the forming the graphene structure is performed by a processing apparatus, the processing apparatus including:
a processing container configured to accommodate the target substrate;
a mounting table configured to horizontally mount the target substrate inside the processing container;
a heating mechanism configured to heat the target substrate;
a microwave introduction device provided on the processing container;
a gas supply mechanism configured to supply a gas including the carbon-containing gas as the film-forming raw material gas into the processing container; and
an exhaust mechanism configured to exhaust an interior of the processing container,
wherein the microwave introduction device includes a microwave generator configured to generate microwaves, and a plurality of microwave radiation mechanisms supplied with the microwaves distributed from the microwave generator and configured to radiate the microwaves into the processing container,
wherein each of the microwave radiation mechanisms includes a tuner configured to perform impedance matching, a planar slot antenna having slots configured to radiate the microwaves, and a microwave transmitting plate that is provided just below the planar slot antenna, fitted to a ceiling wall of the processing container and made of a dielectric material,
wherein the gas supply mechanism supplies a rare gas as a plasma generation gas to the plasma generation region just below the ceiling wall of the processing container, and supplies the carbon-containing gas as the film-forming raw material gas from nozzles, which are fit into openings formed in the ceiling wall and extend downward from the ceiling wall, to the predetermined position between the ceiling wall and the target substrate on the mounting table,
wherein the carbon-containing gas is a gas selected from a group consisting of ethylene ($C_2H_4$), methane ($CH_4$), ethane ($C_2H_6$), propane ($C_3H_8$), propylene ($C_3H_6$), acetylene ($C_2H_2$), methanol ($CH_3OH$), and ethanol ($C_2H_5OH$)), and
wherein the forming the graphene structure is performed under a pressure in a range of 100 mTorr to 5 Torr such that no carbon nanowall grows.

7. The method of claim 6, wherein the surface of the target substrate is an insulator, a semiconductor or a metal.

8. The method of claim 6, wherein the forming the graphene structure is performed under a temperature of the target substrate in a range of 350 to 1000 degrees C., a microwave power in a range of 100 to 5000 W and a time in a range of 1 to 200 min.

* * * * *